(12) United States Patent
Yu

(10) Patent No.: US 12,033,974 B2
(45) Date of Patent: Jul. 9, 2024

(54) DISPLAY PANEL, PREPARATION METHOD THEREOF, AND DISPLAY DEVICE

(71) Applicant: Shanghai Tianma Micro-Electronics Co., Ltd., Shanghai (CN)

(72) Inventor: Quanpeng Yu, Shanghai (CN)

(73) Assignee: Shanghai Tianma Micro-Electronics Co,. Ltd., Shanghai (CN)

( * ) Notice: Subject to any disclaimer, the term of this patent is extended or adjusted under 35 U.S.C. 154(b) by 365 days.

(21) Appl. No.: 17/512,860

(22) Filed: Oct. 28, 2021

(65) Prior Publication Data

US 2022/0052022 A1    Feb. 17, 2022

(30) Foreign Application Priority Data

Apr. 27, 2021 (CN) .......................... 202110459473.8

(51) Int. Cl.
*H01L 23/00* (2006.01)
*H01L 25/075* (2006.01)
*H01L 25/16* (2023.01)

(52) U.S. Cl.
CPC .............. *H01L 24/83* (2013.01); *H01L 24/32* (2013.01); *H01L 24/33* (2013.01); *H01L 24/93* (2013.01);
(Continued)

(58) Field of Classification Search
CPC ......... H01L 24/83; H01L 24/32; H01L 24/33; H01L 24/93; H01L 24/29; H01L 24/30;
(Continued)

(56) References Cited

U.S. PATENT DOCUMENTS

2016/0335470 A1* 11/2016 Park ........................ H01L 24/16

FOREIGN PATENT DOCUMENTS

CN    106133812 A    11/2016
CN    107589578 A    1/2018
(Continued)

OTHER PUBLICATIONS

CN-106133812-A, Aoyagi, Nov. 2016 (Year: 2016).*
(Continued)

*Primary Examiner* — Mary Ellen Bowman
(74) *Attorney, Agent, or Firm* — von Briesen & Roper, s.c.

(57) ABSTRACT

Provided are a display panel, a preparation method thereof, and a display device. The display panel includes a plurality of sub-panels. Each sub-panel includes first substrate, second substrate, bezel adhesive located therebetween, a plurality of bank structures, and a plurality of light-emitting elements. At least one light-emitting element forms a pixel unit. Each bank structure is located between adjacent pixel units. Seaming adhesive is located between adjacent sub-panels. The sub-panels share a same first substrate, and the seaming adhesive is disposed on the same first substrate. The first substrate includes a display region and a non-display region surrounding the display region. The light-emitting elements and the bank structures are located in the display region, and the bezel adhesive is located in the non-display region. In this manner, splicing gaps between adjacent sub-panels can be effectively reduced, and thus the display effect of the display panel can be improved.

19 Claims, 17 Drawing Sheets

(52) U.S. Cl.
CPC ........ *H01L 25/0753* (2013.01); *H01L 25/162* (2013.01); *H01L 25/167* (2013.01); *H01L 24/29* (2013.01); *H01L 24/30* (2013.01); *H01L 2224/26122* (2013.01); *H01L 2224/26152* (2013.01); *H01L 2224/29012* (2013.01); *H01L 2224/30155* (2013.01); *H01L 2224/32137* (2013.01); *H01L 2224/32221* (2013.01); *H01L 2224/33164* (2013.01); *H01L 2224/83191* (2013.01); *H01L 2224/83192* (2013.01); *H01L 2224/83951* (2013.01)

(58) Field of Classification Search
CPC .. H01L 25/0753; H01L 25/162; H01L 25/167
See application file for complete search history.

(56) References Cited

FOREIGN PATENT DOCUMENTS

| | | |
|---|---|---|
| CN | 111128051 A | 1/2018 |
| CN | 209149722 U | 7/2019 |

OTHER PUBLICATIONS

CN-111128051-A, Su, May 2020 (Year: 2020).*
CN-1291351-A, Atherton, Apr. 2001 (Year: 2001).*
CN-110379322-A, Fan, Oct. 2019 (Year: 2019).*
CN-110391200-A, Cao, Oct. 2019 (Year: 2019).*
Chinese First Office Action related to Application No. 202110459473,8, reported on Dec. 14, 2022.

\* cited by examiner

DISPLAY PANEL, PREPARATION METHOD THEREOF, AND DISPLAY DEVICE

CROSS-REFERENCE TO RELATED APPLICATION(S)

The present application claims priority to Chinese Patent Application No. 202110459473.8 filed Apr. 27, 2021, the disclosure of which is incorporated herein by reference in its entirety.

FIELD

Embodiments of the present disclosure relate to the field of display technologies and, in particular, to a display panel, a preparation method thereof, and a display device.

BACKGROUND

Since large-size display panels have a large-scene display effect and can bring the user an immersive visual experience, the large-size display panels are widely used in the display field.

However, a relatively large-size display panel will bring new problems, and thus the display effect is affected.

SUMMARY

Embodiments of the present disclosure provide a display panel, a preparation method thereof, and a display device so that splicing gaps between adjacent sub-panels is reduced and the display effect of the display panel is optimized.

In a first aspect, embodiments of the present disclosure provide a display panel. The display panel includes a plurality of sub-panels and seaming adhesive. Each of the plurality of sub-panels includes a first substrate, a second substrate, bezel adhesive located between the first substrate and the second substrate, a plurality of bank structures, and a plurality of light-emitting elements. At least one of the plurality of light-emitting elements forms a pixel unit. Each of the plurality of bank structures is located between adjacent pixel units.

The seaming adhesive is located between adjacent sub-panels of the plurality of sub-panels.

The plurality of sub-panels share a same first substrate, and the seaming adhesive is disposed on the same first substrate.

The first substrate includes a display region and a non-display region surrounding the display region. The plurality of light-emitting elements and the plurality of bank structures are located in the display region, and the bezel adhesive is located in the non-display region.

In a second aspect, embodiments of the present disclosure further provide a preparation method of a display panel. The preparation method of the display panel includes the steps described below.

A first substrate and a plurality of second substrates are provided, where the first substrate includes a display region and a non-display region surrounding the display region.

A plurality of second substrates are aligned and bonded to the first substrate, where one of the plurality of second substrates and the first substrate form a sub-panel; bezel adhesive, a plurality of bank structures, and a plurality of light-emitting elements are disposed between the first substrate and the plurality of second substrates; at least one of the plurality of light-emitting elements forms a pixel unit; each of the plurality of bank structures is located between adjacent pixel units; the plurality of light-emitting elements and the plurality of bank structures are located in the display region, and the bezel adhesive is located in the non-display region.

Seaming adhesive is formed between adjacent sub-panels on the first substrate.

The seaming adhesive is cured to form a display panel.

In a third aspect, embodiments of the present disclosure further provide a display device. The display device includes the display panel described in the first aspect.

In the display panel, the preparation method, and the display device provided in embodiments of the present disclosure, the plurality of sub-panels share a same first substrate, the seaming adhesive is disposed on the same first substrate and located between adjacent second substrates, and the bezel adhesive located in the non-display region is disposed between the first substrate and the second substrate. In the related art, the bezel of the display region of each sub-panel is provided with bezel adhesive, which causes that during the splicing process of adjacent sub-panels, due to the presence of the bezel adhesive at the bezel of display region of each sub-panel, the bezel adhesive at the splicing region occupies a relatively large width, and causes that the display effect is affected. In the display panel provided in embodiments of the present disclosure, the bezel adhesive is disposed for the non-display region of the sub-panel, and the seaming adhesive rather than the bezel adhesive is disposed for the splicing regions of adjacent sub-panels, so that the area of the display region of the display panel occupied by the bezel adhesive can be reduced, and splicing gaps between the sub-panels can be reduced, thus the continuity of the display picture and the splicing effect of the display panel can be ensured.

BRIEF DESCRIPTION OF DRAWINGS

In order that technical solutions in embodiments of the present disclosure or the related art are described more clearly, drawings to be used in the description of the embodiments or the related art are briefly described hereinafter. Apparently, while the drawings in the description are merely some embodiments of the present disclosure. For those skilled in the art, these drawings may be expanded and extended to other structures and drawings according to the basic concepts disclosed and indicated in embodiments of the present disclosure. These are undoubtedly all within the scope of the claims of the present disclosure.

DETAILED DESCRIPTION

Figure 1:
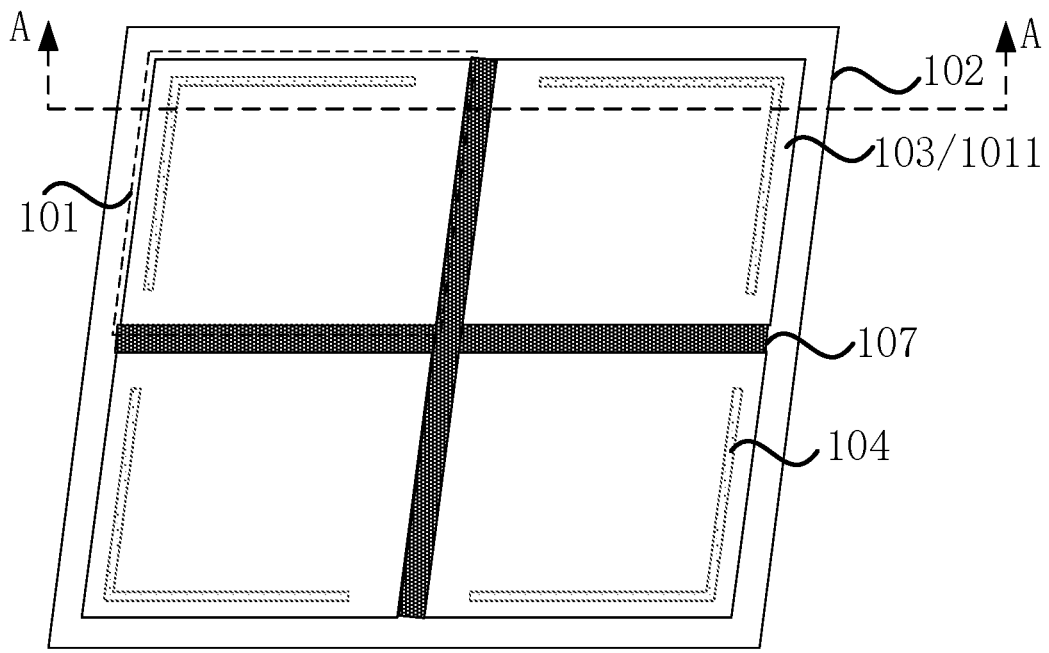
FIG. 1 is a top view of a display panel according to an embodiment of the present disclosure.

In order that the objects, technical solutions and advantages of the present disclosure are clearer, the technical solutions of the present disclosure are described more clearly and completely hereinafter with reference to drawings of embodiments of the present disclosure and in conjunction with implementations. Apparently, the embodiments described herein are some embodiments, not all embodiments, of the present disclosure. All other embodiments obtained by those skilled in the art based on the basic concepts disclosed and indicated in embodiments of the present disclosure are within the scope of the present disclosure.

When a large-size display panel is prepared, the large-size display panel is usually formed by splicing a plurality of sub-panels. Each bezel of each sub-panel is provided with bezel adhesive, and considering the process precision of the bezel adhesive, a certain region needs to be reserved at the bezel of the sub-panel. In this manner, a relatively wide splicing gaps between adjacent sub-panels exists, which undoubtedly destroys the continuity of the image displaying of the display device, thereby affecting the display effect.

In view of the problems in the Background, embodiments of the present disclosure provide a structure diagram of a display panel. The display panel includes a plurality of sub-panels and seaming adhesive. Each of the plurality of sub-panels includes a first substrate, a second substrate, bezel adhesive located between the first substrate and the second substrate, a plurality of bank structures, and a plurality of light-emitting elements. At least one of the plurality of light-emitting elements forms a pixel unit. Each of the plurality of bank structures is located between adjacent pixel units. The seaming adhesive is located between adjacent sub-panels. The plurality of sub-panels share a same first substrate, and the seaming adhesive is disposed on the same first substrate. The first substrate includes a display region and a non-display region surrounding the display region. The plurality of light-emitting elements and the plurality of bank structures are located in the display region, and the bezel adhesive is located in the non-display region.

In the preceding technical solution, the plurality of sub-panels share a same first substrate, the seaming adhesive is disposed on the same first substrate and located between adjacent second substrates, and the bezel adhesive located in the non-display region is disposed between the first substrate and the second substrate. In the related art, the bezel of the display region of each sub-panel is provided with bezel adhesive, which causes that during the splicing process of adjacent sub-panels, due to the presence of the bezel adhesive at the bezel of display region of each sub-panel, the bezel adhesive at the splicing region occupies a relatively large width, and causes that the display effect is affected. In the display panel provided in embodiments of the present disclosure, the bezel adhesive is disposed for the non-display region of the sub-panel, and the seaming adhesive rather than the bezel adhesive is disposed for the splicing regions of adjacent sub-panels, so that the area of the display region of the display panel occupied by the bezel adhesive can be reduced, and splicing gaps between the sub-panels can be reduced, thus the continuity of the display picture and the splicing effect of the display panel can be ensured.

The above is the core concept of the present disclosure, and technical solutions in embodiments of the present disclosure will be described clearly and completely in conjunction with the drawings in embodiments of the present disclosure. Based on embodiments of the present disclosure, all other embodiments obtained by those of ordinary skill in the art on the premise that no creative work is done are within the scope of the present disclosure.

Figure 2:
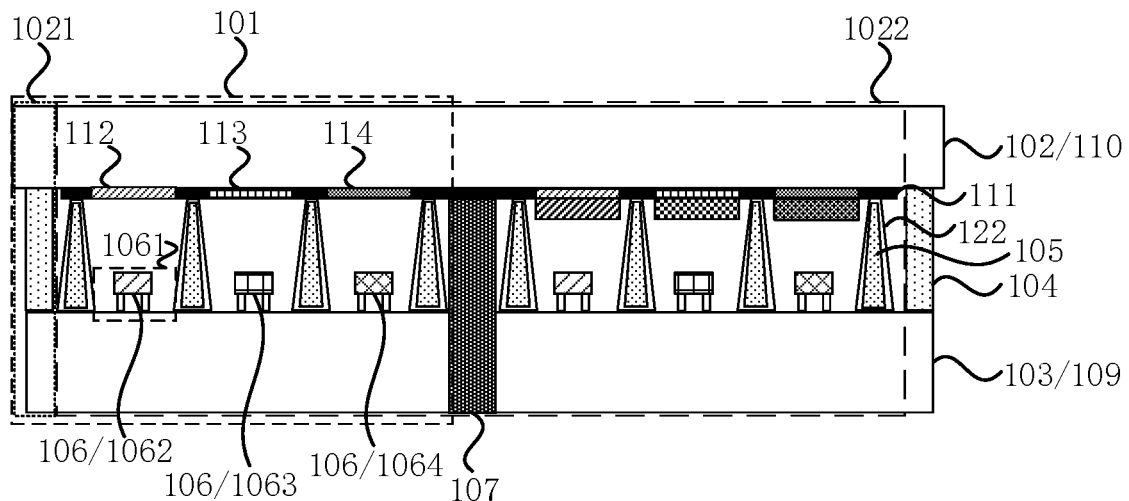
FIG. 2 is a sectional view taken along AA of FIG. 1.

FIG. 1 is a top view of a display panel according to an embodiment of the present disclosure, and FIG. 2 is a sectional view taken along AA of FIG. 1. As shown in FIGS. 1 and 2, a display panel 100 includes a plurality of sub-panels 101 and seaming adhesive 107.

Each of the plurality of sub-panels 101 includes a first substrate 102, a second substrate 103, bezel adhesive 104 located between the first substrate 102 and the second substrate 103, a plurality of bank structures 105, and a plurality of light-emitting elements 106. At least one light-emitting element 106 forms a pixel unit 1061. Each bank structure 105 is located between adjacent pixel units 1061.

The seaming adhesive 107 is located between adjacent sub-panels 101.

The plurality of sub-panels 101 share a same first substrate 102, and the seaming adhesive 107 is disposed on the same first substrate 102.

The first substrate 102 includes a display region 1021 and a non-display region 1022 surrounding the display region 1021. The display region 1021 is spliced and displayed by the sub-panels 101. The light-emitting elements 106 and the bank structures 105 are located in the display region 1021, and the bezel adhesive 104 is located in the non-display region 1022.

The bezel adhesive 104 is located between the first substrate 102 and the second substrate 103 and is located in the non-display region 1022 of the first substrate 102. The first substrate 102 is bonded to the second substrate 103 in the non-display region 1022 through the bezel adhesive 104. The seaming adhesive 107 is located between the second substrates 103 of the adjacent sub-panels 101, the seaming adhesive 107 may achieve the bonding and splicing between the adjacent sub-panels 101, and the sub-panels 101 are sealed through the bezel adhesive 104 and the seaming adhesive 107 so that external water and oxygen can be prevented from damaging the plurality of light-emitting elements 106 and other film layers between the first substrate 102 and the second substrate 103.

In an embodiment, each light-emitting element 106 may be a micro light-emitting diode (Micro LED) or a mini light-emitting diode (Mini LED). It is to be noted that the type of the light-emitting element 106 includes but is not limited to the examples.

In an embodiment, the bezel adhesive 104 may be an epoxy resin oligomer, an acrylic monomer, a photoinitiator, a thermal curing agent, a crosslinking agent, filler, or an additive. The thermal curing agent mainly includes materials such as ether oxygen groups. The bezel adhesive 104 may be a colorless transparent material, a colored transparent material, or a non-transparent material.

In an embodiment, the material of the seaming adhesive 107 includes acrylic glue. The seaming adhesive 107 may be acrylic glue. Different from traditional adhesives, acrylic glue has advantages such as fast bonding speed, high strength, no bubbles, no whitening, no yellowing, no cracking, and excellent transparency, and the acrylic glue may be cured instantly with the help of sunlight or natural light, and no ultraviolet light is needed, so that the production costs can be saved greatly.

Figure 3:
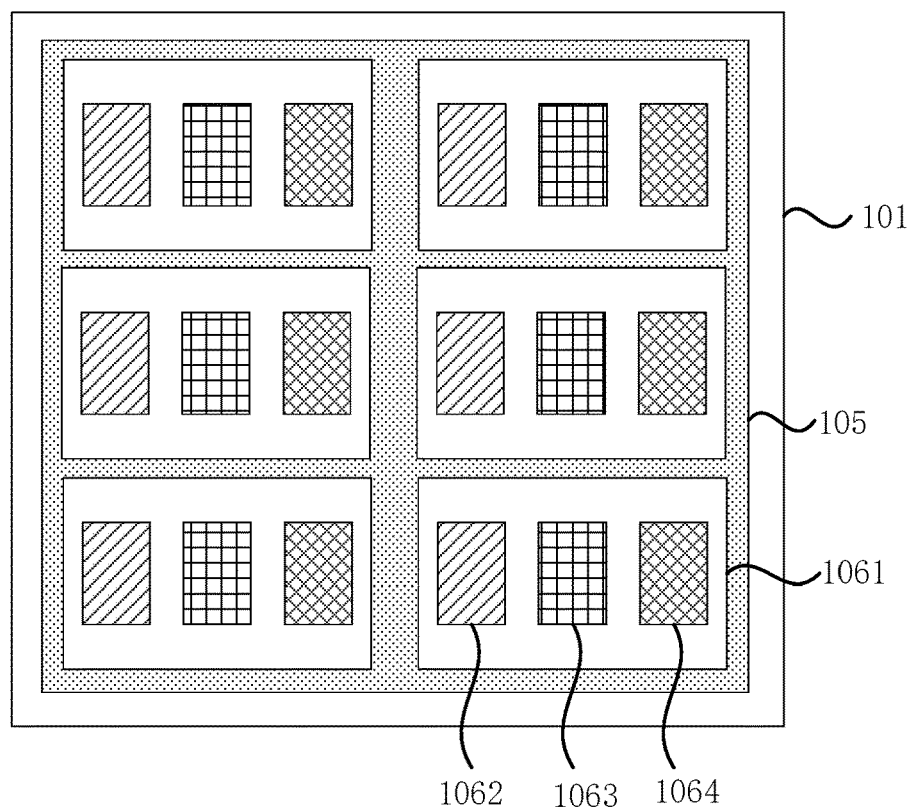
FIG. 3 is atop view illustrating the structure between a light-emitting element and a bank structure according to an embodiment of the present disclosure.
Figure 4:
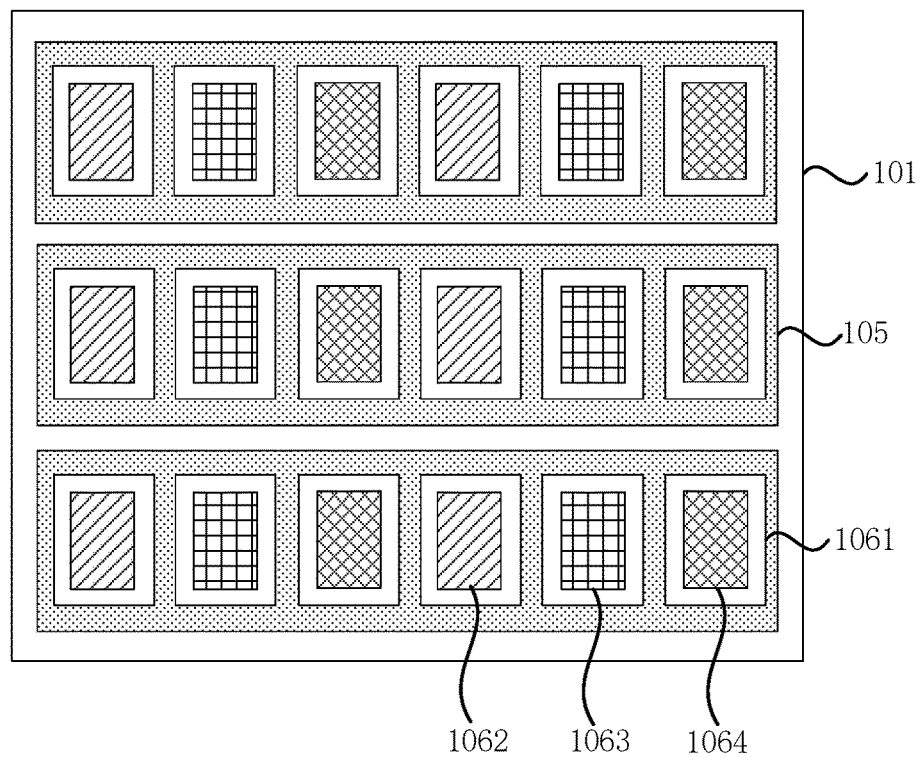
FIG. 4 is another top view illustrating the structure between a light-emitting element and a bank structure according to an embodiment of the present disclosure.

It is to be noted that at least one light-emitting element 106 forms the pixel unit 1061, which means the pixel unit 1061 may be formed by one light-emitting element 106, or may be formed by a plurality of light-emitting elements 106. For example, the pixel unit 1061 may be formed by three light-emitting elements 106. By way of example, FIG. 3 is a top view illustrating the structure between a light-emitting element and a bank structure according to an embodiment of the present disclosure. As shown in FIG. 3, a pixel unit 1061 is composed of a red light-emitting element 1062, a green light-emitting element 1063, and a blue light-emitting element 1064, and the bank structures 105 are disposed between adjacent pixel units 1061 to prevent optical crosstalk between adjacent pixel units 1061. FIG. 4 is another top view illustrating the structure between a light-emitting element and a bank structure according to an embodiment of the present disclosure. As shown in FIG. 4, the pixel unit 1061 includes one light-emitting element. For example, each of the red light-emitting element 1062, the green light-emitting element 1063, and the blue light-emitting element 1064 form one pixel unit 1061, and the bank structure 105 is disposed between two adjacent light-emitting elements 106 to prevent optical crosstalk from generating among lights emitted from different light-emitting elements 106.

With continued reference to FIGS. 1 and 2, in this embodiment, the plurality of sub-panels 101 share a same first substrate 101, the seaming adhesive 107 is located between the second substrates 103 of adjacent sub-panels 101, the seaming adhesive 107 is disposed on the first substrate 102, and the seaming adhesive 107 is used to fill the gaps between the second substrates 103 of adjacent sub-panels 101 so that the bonding between sub-panels 101 is achieved. Further, since the seaming adhesive 107 is disposed between adjacent sub-panels 101, in two adjacent sub-panels 101, the bezel adhesive does not need to be disposed on sides of the two adjacent sub-panels 101 closer to the seaming adhesive 107, and a certain region does not need to be reserved, avoiding the preparation process error of the bezel adhesive, and the area of the display region occupied by the bezel adhesive 104 disposed between adjacent sub-panels 101 in the related art can be reduced. In this manner, the gaps between the sub-panels 101 can be reduced, and thus the continuity of the display picture and the splicing effect of the display panel can be ensured.

In an embodiment, with continued reference to FIG. 2, the first substrate 102 is provided with a plurality of bank structures 105; the second substrate 103 is provided with a plurality of light-emitting elements 106, that is, the substrate provided with the bank structures 105 serves as the first substrate 102, and the substrate provided with the light-emitting elements 106 serves as the second substrate 103. In an embodiment, the first substrate 102 is further provided with a black matrix 111, a red color resistance block 112, a green color resistance block 113, and a blue color resistance block 114. The black matrix 111 is provided to block the light leakage between the light-emitting elements 106. Each of the color resistance blocks is provided so that the absorption rate of light of the corresponding wavelength can be improved. The red color resistance block 112 allows red light to pass, the green color resistance block 113 allows green light to pass, and the blue color resistance block 114 allows blue light to pass so that the optical purity of the emitted light can be ensured.

Figure 5:
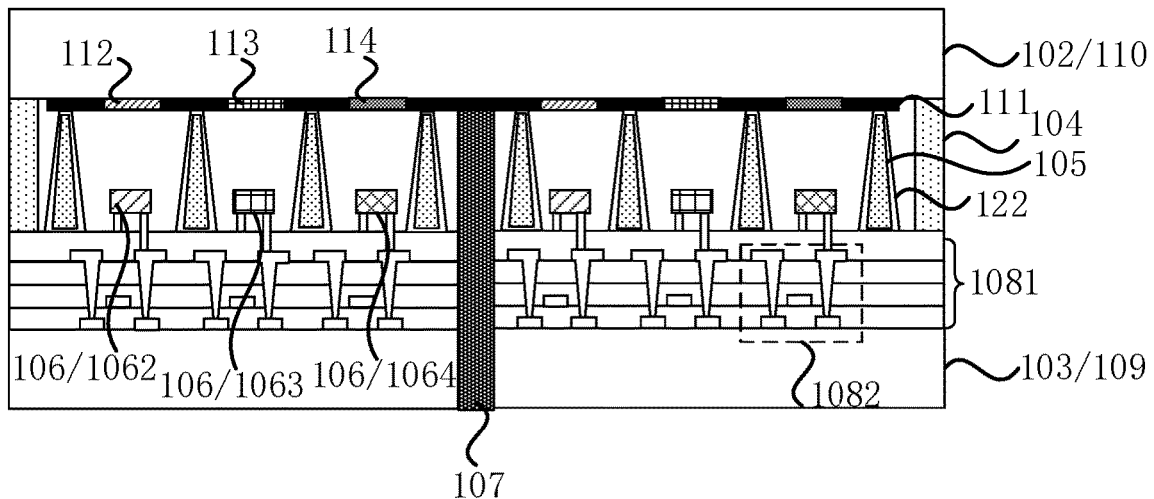
FIG. 5 is a structure diagram of a film layer of a display panel according to an embodiment of the present disclosure.

In an embodiment, the method for driving the light-emitting elements 106 to emit light may be a passive driving method or an active driving method. By way of example, FIG. 5 is a structure diagram of a film layer of a display panel according to an embodiment of the present disclosure. As shown in FIG. 5, the method for driving the light-emitting elements 106 to emit light is the active driving method. In this case, the second substrate 103 is further provided with a pixel driving circuit layer 1081, the pixel driving circuit layer 1081 includes a plurality of pixel driving circuits 1082, and a plurality of pixel driving circuits 1082 are electrically connected to a plurality of light-emitting elements 106 in a one-to-one correspondence. Each pixel driving circuit 1082 for driving the light-emitting element 106 to emit light may be a 3T1C circuits, that is, a circuit with three thin-film transistors and one storage capacitor, or may be a 7T1C circuit, that is, a circuit with seven thin-film transistors and one storage capacitor.

Figure 6:
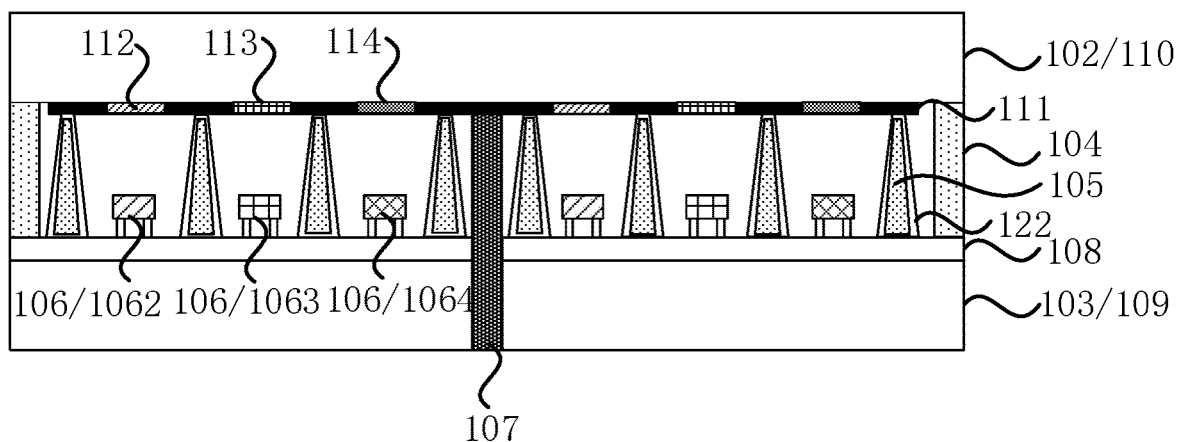
FIG. 6 is a structure diagram of a film layer of a display panel according to another embodiment of the present disclosure.

FIG. 6 is a structure diagram of a film layer of a display panel according to another embodiment of the present disclosure. As shown in FIG. 6, the method for driving the light-emitting elements 106 to emit light is the passive driving method. In this case, the second substrate 103 is further provided with a metal layer 108, the metal layer 103 is provided with a signal line, and the signal line is configured to be connected to the light-emitting elements 106. In this manner, the pixel driving circuit does not need to be separately provided, and only the signal line is needed to provide a light-emitting voltage signal.

Figure 7:
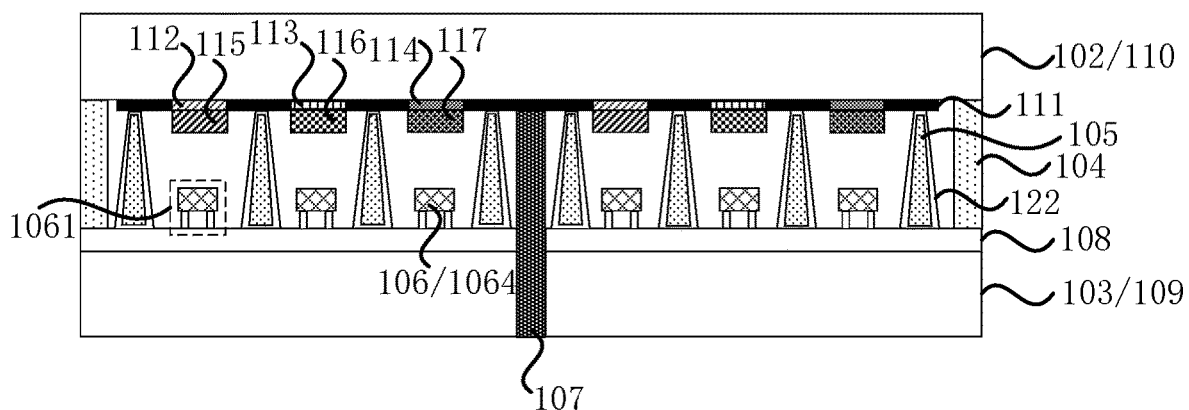
FIG. 7 is a structure diagram of a film layer of a display panel according to another embodiment of the present disclosure.

In an embodiment, FIG. 7 is a structure diagram of a display panel according to another embodiment of the present disclosure. As shown in FIG. 7, in the case where the light-emitting elements 106 emit light of a same color, for example, the light-emitting element 106 is the blue light-emitting element 1064, and quantum dots are disposed on a side of the color resistance block closer to the light-emitting element 106. For example, red quantum dots 115 are disposed at a position corresponding to the red color resistance block 112, green quantum dots 116 are disposed at a position corresponding to the green color resistance block 113, and a scattering material 117 is disposed at a position corresponding to the blue color resistance block 114. The red quantum dots 115 are configured to convert blue light emitted by the light-emitting element 106 into red light, the green quantum dots 116 are configured to convert blue light emitted by the light-emitting element 106 into green light, and the scattering material 117 is configured to ensure that the emitted blue light is uniform. In this manner, the light emitted by the light-emitting element 106 passing through the red quantum dots 115, the green quantum dots 116, and the scattering material 117, are enabled to achieve the color light-emitting of the display panel.

With continued reference to FIG. 1, in an embodiment, the first substrate 102 also serves as a cover plate of the display panel 100.

In the case where the substrate provided with the bank structures 105 serves as the first substrate 102, and the substrate provided with the light-emitting elements 106 serves as the second substrate 103, after the first substrate 102 is bonded to the second substrate 103, the first substrate 102 may isolate external water and oxygen and play the same role as the cover plate of the display panel 100. Therefore, the first substrate 102 may also serve as the cover plate of the display surface 100 so that the display effect of the display panel 100 can be ensured, and the production costs can be reduced.

Figure 8:
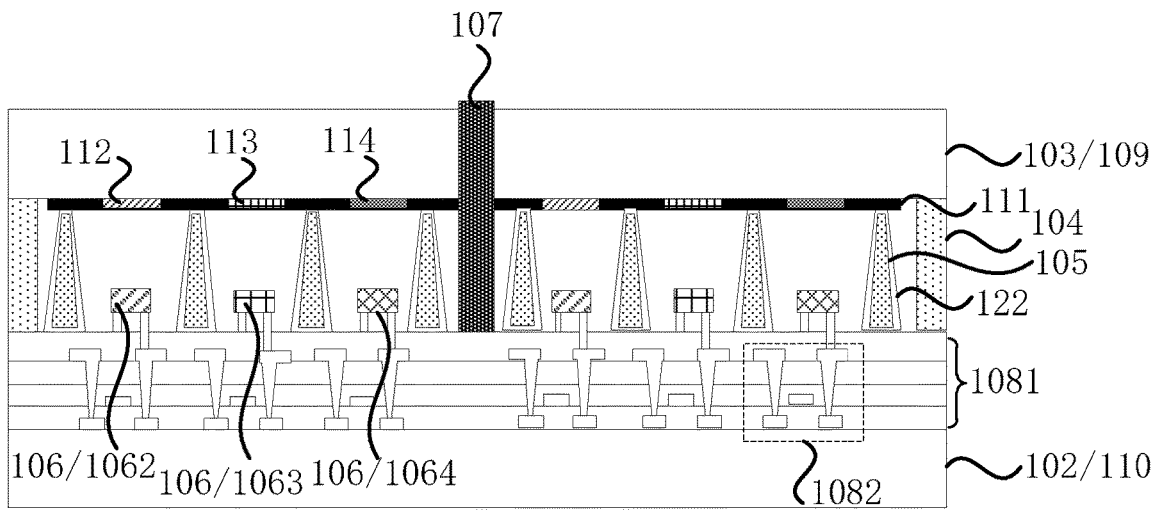
FIG. 8 is a structure diagram of a film layer of a display panel according to another embodiment of the present disclosure.

In an embodiment, FIG. 8 is a structure diagram of a film layer of a display panel according to another embodiment of the present disclosure. As shown in FIG. 8, a plurality of light-emitting elements 106 are disposed on the first substrate 102; and a plurality of bank structures 105 are disposed on the second substrate 103. That is, the substrate provided with the light-emitting elements 106 serves as the first substrate 102, and the substrate provided with the bank structures 105 serves as the second substrate 103. In an embodiment, the second substrate 103 is further provided with a black matrix 111, a red color resistance block 112, a green color resistance block 113, and a blue color resistance block 114. The black matrix 111 is provided to block the light leakage between the light-emitting elements 106. Each of the color resistance blocks is provided so that the absorption rate of light of the corresponding wavelength can be improved. The red color resistance block 112 allows red light to pass, the green color resistance block 113 allows green light to pass, and the blue color resistance block 114 allows blue light to pass so that the optical purity of the emitted light can be ensured. In an embodiment, the method for driving the light-emitting elements 106 to emit light may be a passive driving method or an active driving method. By way of example, as shown in FIG. 8, the method for driving the light-emitting elements 106 to emit light is the active driving method. In this case, the first substrate 102 is further provided with a pixel driving circuit layer 1081, the pixel driving circuit layer 1081 includes a plurality of pixel driving circuits 1082, and a plurality of pixel driving circuits 1082 are electrically connected to a plurality of light-emitting elements 106 in a one-to-one correspondence. Each pixel driving circuit 1082 for driving the light-emitting element 106 to emit light may be a 3T1C circuits, that is, a circuit with three thin-film transistors and one storage capacitor, or a 7T1C circuit, that is, a circuit with seven thin-film transistors and one storage capacitor.

Figure 9:
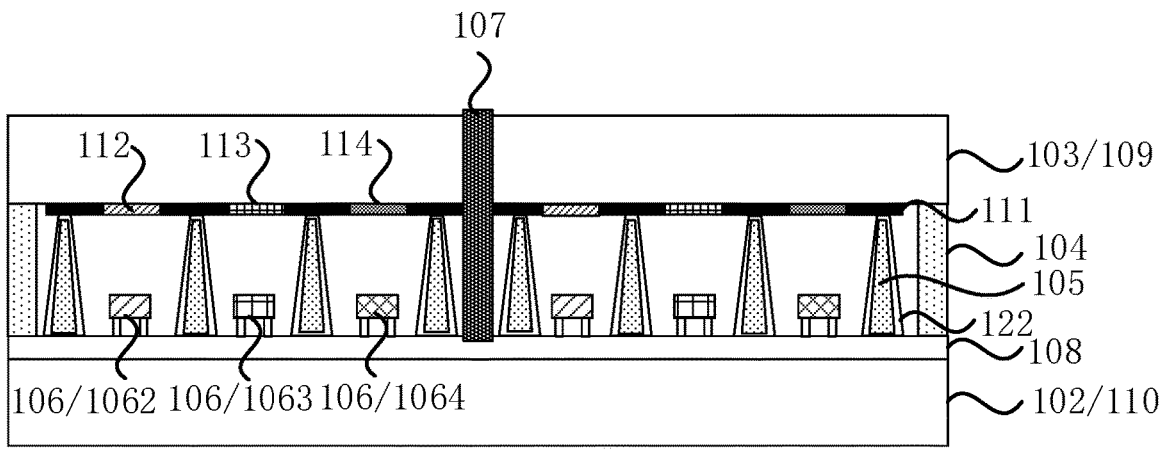
FIG. 9 is a structure diagram of a film layer of a display panel according to another embodiment of the present disclosure.

FIG. 9 is a structure diagram of a film layer of a display panel according to another embodiment of the present disclosure. As shown in FIG. 9, the method for driving the light-emitting elements 106 to emit light is the passive driving method. In this case, the first substrate 102 is further provided with a metal layer 108, the metal layer 108 is provided with a signal line, and the signal line is configured to be connected to the light-emitting elements 106. In this manner, the pixel driving circuit does not need to be separately provided, and only the signal line is needed to provide a light-emitting voltage signal.

Figure 10:
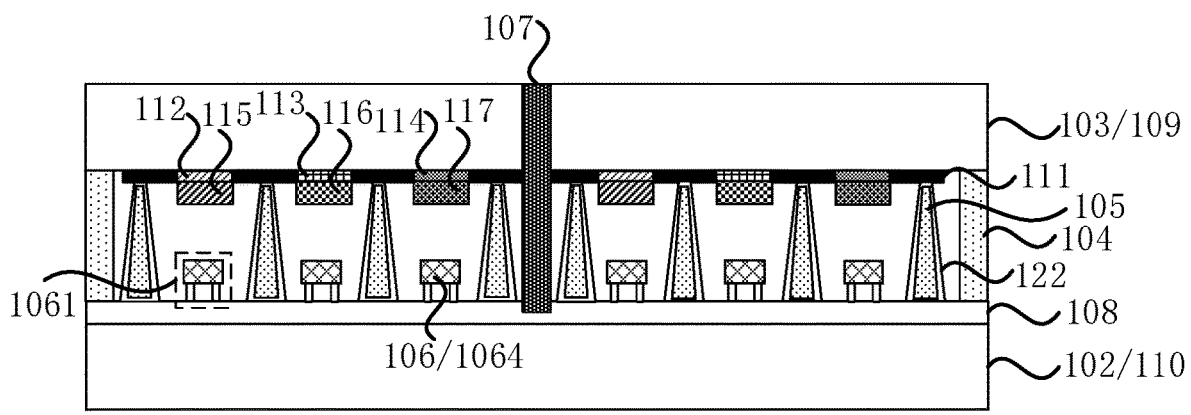
FIG. 10 is a structure diagram of a film layer of a display panel according to another embodiment of the present disclosure.

Based on the preceding embodiments, in an embodiment, FIG. 10 is a structure diagram of a film layer of a display panel according to another embodiment of the present disclosure. As shown in FIG. 10, in the case where the light-emitting elements 106 on the first substrate 102 emit light of the same color, for example, the light-emitting element 106 is the blue light-emitting element 1064, and quantum dots are disposed on a side of the color resistance block closer to the light-emitting element 106; red quantum dots 115 are disposed at a position corresponding to the red color resistance block 112, green quantum dots 116 are disposed at a position corresponding to the green color resistance block 113, and a scattering material 117 is disposed at a position corresponding to the blue color resistance block 114; the red quantum dots 115 are configured to convert blue light emitted by the light-emitting element 106 into red light, the green quantum dots 116 are configured to convert blue light emitted by the light-emitting element 106 into green light, and the scattering material 117 is configured to ensure that the blue light emitted is uniform. In this manner, the light emitted by the light-emitting element 106 passes through the red quantum dots 115, the green quantum dots 116, and the scattering material 117 so that the color light-emitting of the display panel can be achieved.

Figure 11:
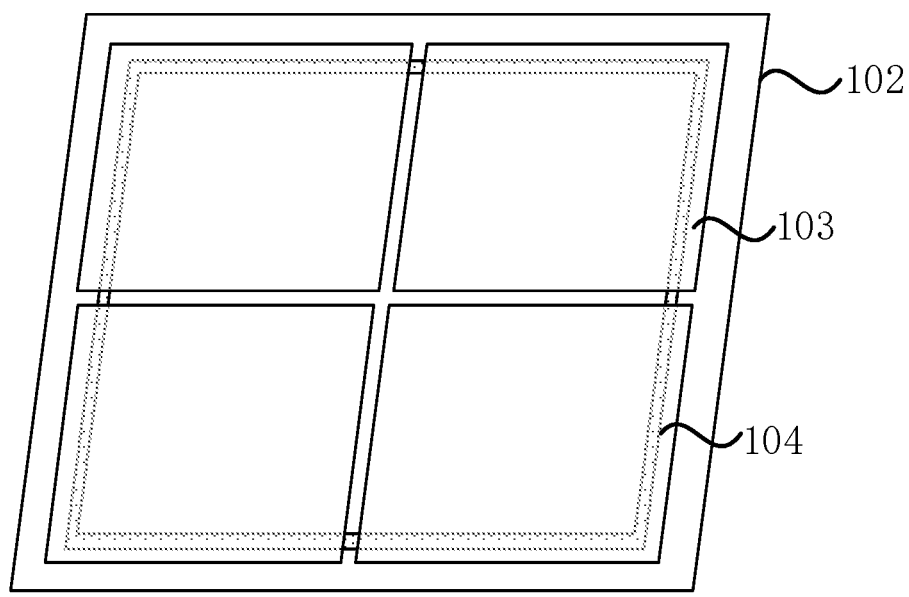
FIG. 11 is a top view of a display panel according to another embodiment of the present disclosure.

In an embodiment, FIG. 11 is a top view of a display panel according to another embodiment of the present disclosure. As shown in FIG. 11, the bezel adhesive 104 is disposed on the first substrate 102. That is, the bezel adhesive 104 may be directly formed on the first substrate 102. In this manner, preparation can be completed directly through a single process so that the process steps can be simplified, and thus the preparation efficiency of the display panel can be improved. It is to be understood that, to clearly show the bezel adhesive 104 in FIG. 11, the seaming adhesive 107 is not shown.

In an embodiment, with continued reference to FIG. 11, the bezel adhesive 104 forms a closed ring structure.

The bezel adhesive 104 is a closed ring structure formed on the first substrate 102. The bezel adhesive 104 is a closed ring structure so that each sub-panel 101 has good sealing performance, and thus external water and oxygen can be prevented from affecting quantum dots or bank structures composed of the organic material inside the sub-panel 101.

In an embodiment, with continued reference to FIG. 1, a plurality of sub-panels 101 form an array structure of M rows and N columns. In FIG. 1, the case where a plurality of sub-panels 101 form an array structure of two rows and two columns is used as an example for description.

With continued reference to FIG. 1, the sub-panels 101 include first-type sub-panels 1011 and second-type sub-panels 1012.

The first-type sub-panels 1011 refer to sub-panels located in the first row and the first column, sub-panels located in the first row and the N-th column, sub-panels located in the M-th row and the first column, and sub-panels located in the M-th row and the N-th column of the array structure.

The second-type sub-panels 1012 refer to the sub-panels 101 in the plurality of sub-panels other than the first-type sub-panels 1011.

The bezel adhesive 104 of each first-type sub-panel 1011 is located on two bezels of the first-type sub-panel 1011.

The bezel adhesive 104 of each second-type sub-panel 1012 is located on one bezel of the second-type sub-panel 1012.

M and N are both positive integers, where M=2, and N≥2.

In an embodiment, M and N are both integers, where N=2, and M≥2.

By way of example, a plurality of sub-panels 101 form an array structure of two rows and two columns, where M=2 and N=2. In this case, the sub-panels 101 only include the first-type sub-panels 1011. The seaming adhesive 107 is located between any two adjacent first-type sub-panels 1011 so that four first-type sub-panels 1011 are spliced on the same first substrate 102. The bezel adhesive does not need to be disposed on a side of the sub-panel 101 closer to the seaming adhesive 107, and a certain region does not need to be reserved, avoiding the preparation process error of the bezel adhesive, and the area of the display region occupied by the bezel adhesive 104 disposed between adjacent sub-panels 101 in the related art can be reduced. In this manner, the gaps between the sub-panels 101 can be reduced, and thus the continuity of the display picture and the splicing effect of the display panel can be ensured. The seaming adhesive 107 may achieve the splicing between two adjacent first-type sub-panels 1011, and the bezel adhesive 104 on the first substrates 102 and the seaming adhesive 107 may ensure the display effect and sealing performance of the display panel 100.

Figure 12:
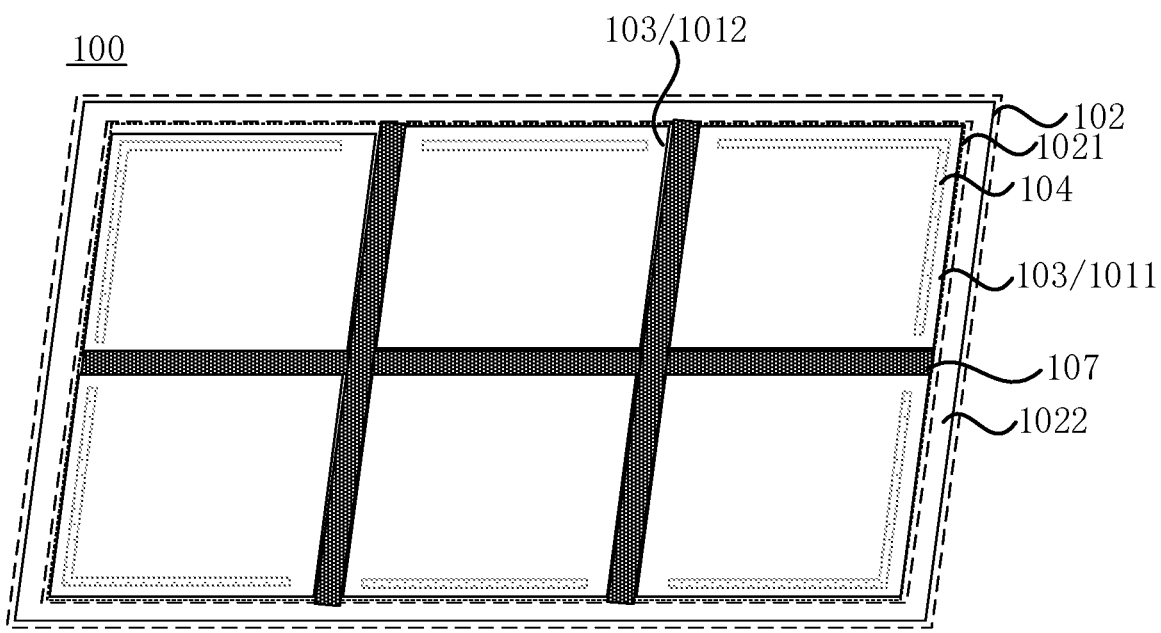
FIG. 12 is a top view of a display panel according to another embodiment of the present disclosure.

By way of example, FIG. 12 is a top view of a display panel according to another embodiment of the present disclosure. As shown in FIG. 12, a plurality of sub-panels form an array structure of two rows and three columns, where M=2, and N=3. By way of example, the case where a plurality of sub-panels 101 form an array structure of two rows and three columns is used as an example. As shown in FIG. 12, four first-type sub-panels 1011 and two second-type sub-panels 1012 form a display panel for display. In this case, the display region is formed by a plurality of sub-panels 101 and the seaming adhesive 107 between the sub-panels 101, and the non-display region 1022 surrounds the display region 1021. The bezel adhesive 104 of each first-type sub-panel 1011 is located on two bezels of the first-type sub-panel 1011, the two bezels intersect, and the bezel adhesive 104 at positions corresponding to the two bezels intersects. At the same time, the bezel adhesive 104 of each second-type sub-panel 1012 is located on one bezel of the second-type sub-panel 1012, that is, the bezel adhesive 104 surrounds the display region 1021; and the bezel of the sub-panel without the bezel adhesive 104 is provided with the seaming adhesive 107. Since the bezel adhesive 104 does not need to be disposed on a side of the sub-panel 101 closer to the seaming adhesive 107, and a certain region does not need to be reserved, avoiding the preparation process error of the bezel adhesive, and the area of the display region occupied by the bezel adhesive 104 disposed between adjacent sub-panels 101 in the related art can be reduced. In this manner, the gaps between the sub-panels 101 can be reduced, and thus the continuity of the display picture and the splicing effect of the display panel can be ensured.

Figure 13:
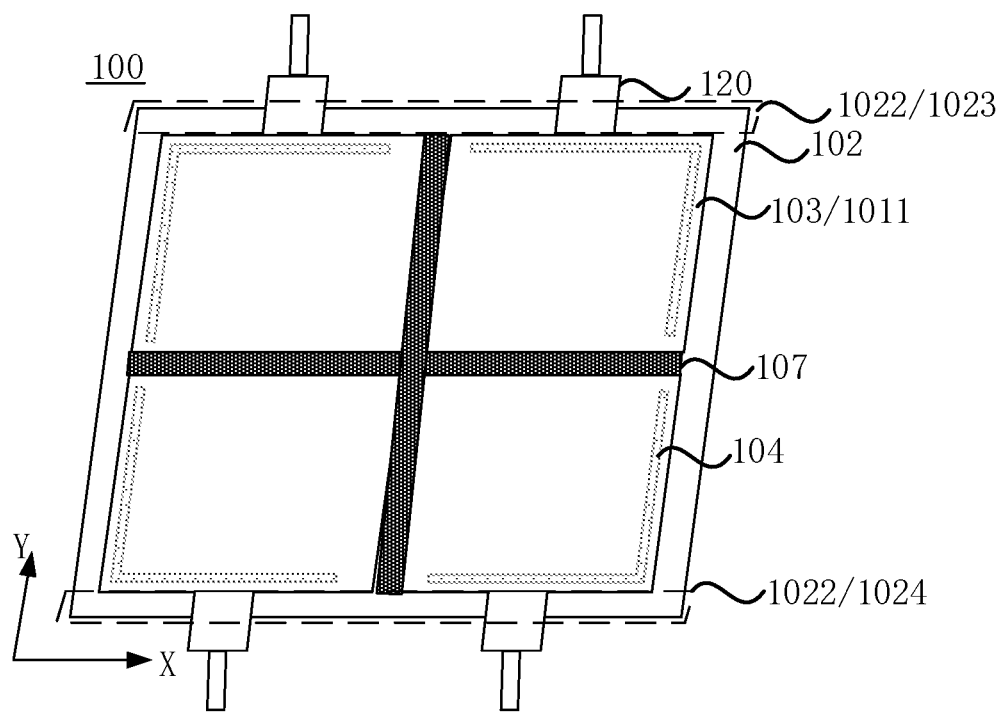
FIG. 13 is a top view of a display panel according to another embodiment of the present disclosure.

In an embodiment, FIG. 13 is a top view of a display panel according to another embodiment of the present disclosure. As shown in FIG. 13, the sub-panel 101 further includes a flexible circuit board 120, and the non-display region 1022 includes a first non-display region 1023 and a second non-display region 1024.

The display panel 100 includes sub-panels 101 in two rows and N columns. The flexible circuit board 120 of the sub-panel 101 in the first row is bound to the first non-display region 1023, and the first non-display region 1023 is the non-display region 1022 on a side of the sub-panels 101 in the first row farther from the sub-panel 101 in the second row. The flexible circuit board 120 of the sub-panels 101 in the second row is bound to the second non-display region 1024, and the second non-display region 1024 is the non-display region 1022 on a side of the sub-panels 101 in the second row farther from the sub-panel 101 in the first row. In FIG. 13, the case where the display panel 100 includes sub-panels 101 in two rows and two columns is used as an example for description.

In this embodiment, the flexible circuit board 120 of the sub-panel 101 in the first row is bound to the first non-display region 1023, and the first non-display region 1023 is the non-display region 1022 on a side of the sub-panels 101 in the first row farther from the sub-panels 101 in the second row; the flexible circuit board 120 of the sub-panel 101 in the second row is bound to the second non-display region 1024, and the second non-display region 1024 is the non-display region 1022 on a side of the sub-panels 101 in the second row farther from the sub-panels 101 in the first row. The flexible circuit board 120 is bound and arranged along the Y direction in the figure so that the extension length of the non-display region 1022 in the X direction can be effectively reduced, and thus the area of the non-display region of the display panel 100 in the X direction can be reduced.

Figure 14:
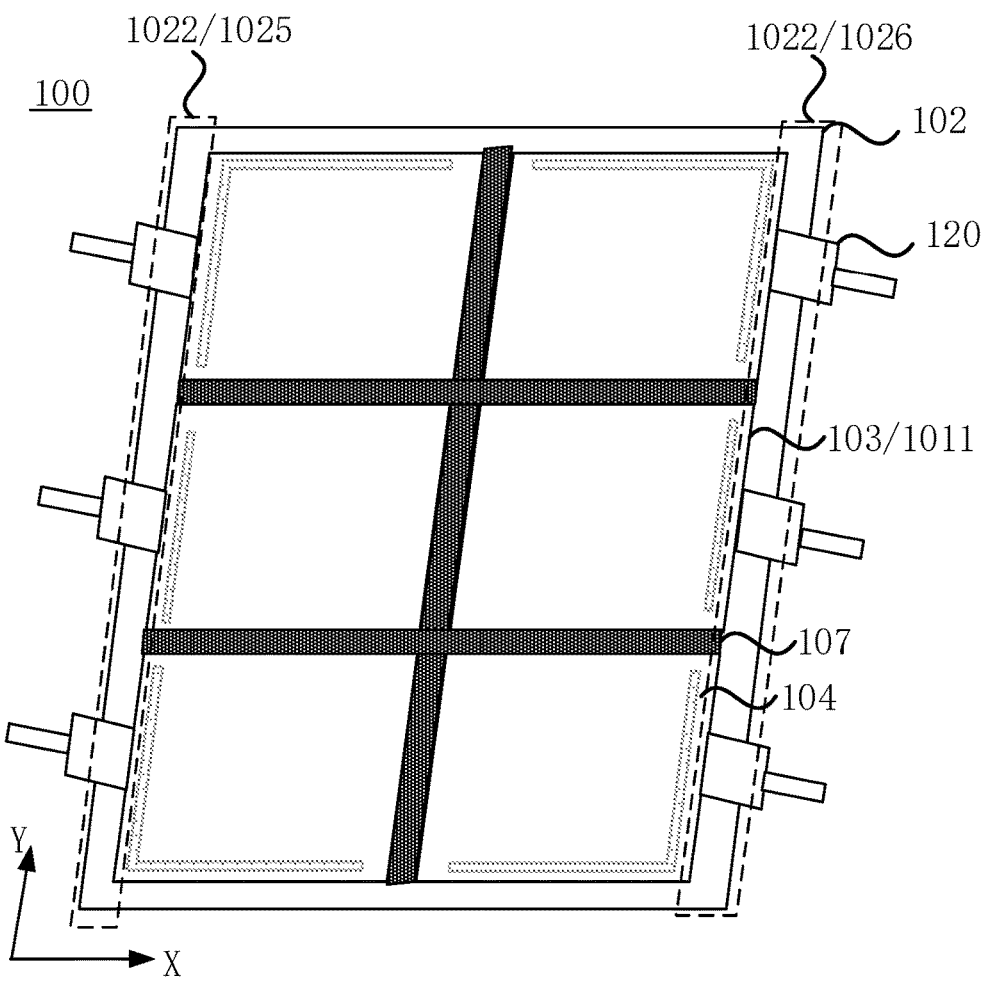
FIG. 14 is a top view of a display panel according to another embodiment of the present disclosure.

In an embodiment, FIG. 14 is a top view of a display panel according to another embodiment of the present disclosure, where the display panel 100 includes sub-panels 101 in M rows and two columns, the flexible circuit board 120 of the sub-panel 101 in the first column is bound to a third non-display region 1025, and the third non-display region 1025 is the non-display region 1022 on a side of the sub-panels 101 in the first column farther from the sub-panels 101 in the second column; the flexible circuit board 120 of the sub-panel 101 in the second column is bound to a fourth non-display region 1026, and the fourth non-display region 1026 is the non-display region 1022 on a side of the sub-panels 101 in the second column farther from the sub-panels 101 in the first column. In FIG. 14, the case where the display panel 100 includes three rows and two columns of sub-panels 101 is used as an example for description.

Figure 15:
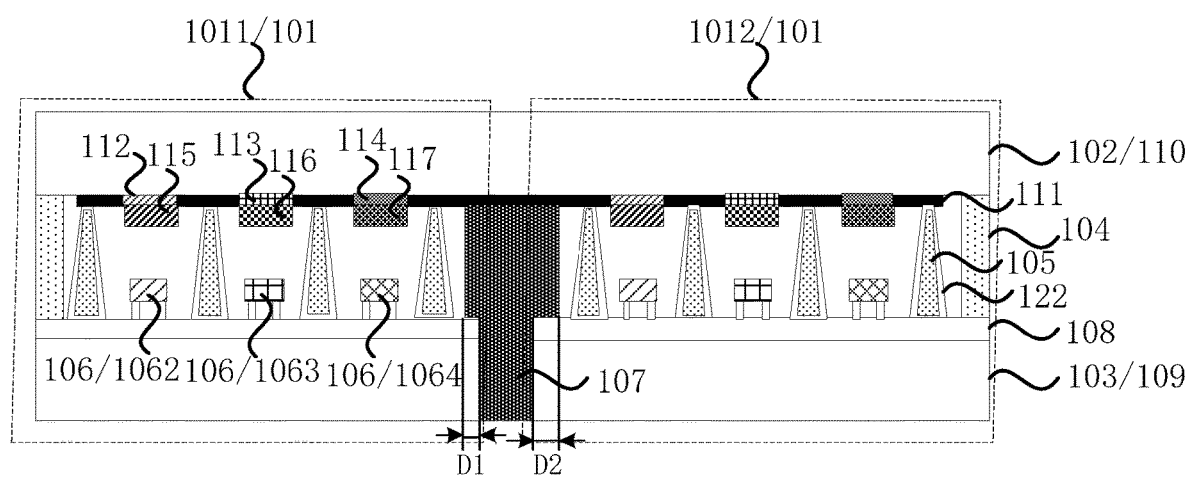
FIG. 15 is a structure diagram of a film layer of a display panel according to another embodiment of the present disclosure.

As shown in FIG. 14, the flexible circuit board 120 of the sub-panel 101 in the first column is bound to the third non-display region 1025, and the third non-display region 1025 is the non-display region 1022 on a side of the sub-panels 101 in the first column farther from the sub-panels 101 in the second column; the flexible circuit board 120 of the sub-panel 101 in the second column is bound to the fourth non-display region 1026, and the fourth non-display region 1026 is the non-display region 1022 on a side of the sub-panels 101 in the second column farther from the sub-panels 101 in the first column. The flexible circuit board 120 is bound and arranged along the X direction in the figure so that the extension length of the non-display region 1022 in the Y direction can be effectively reduced, and thus the area of the non-display region of the display panel 100 in the Y direction can be reduced. In an embodiment, FIG. 15 is a structure diagram of a film layer of a display panel according to another embodiment of the present disclosure. As shown in FIG. 15, the seaming adhesive 107 between the first-type sub-panels 1011 and the second-type sub-panels 1012 extends between the first substrate 102 and the plurality of second substrates 103.

In the direction parallel to the extension direction of the seaming adhesive 107 and parallel to the first substrate 102, the width of the seaming adhesive 107 extending between the first substrate 102 and the plurality of second substrates 103 corresponding to the first-type sub-panels 1011 is a first width D1; the width of the seaming adhesive 107 extending between the first substrate 102 and the plurality of second substrates 103 corresponding to the second-type sub-panels 1012 is a second width D2.

The first width D1 is less than the second width D2.

Considering that two bezels of the first-type sub-panel 1011 are provided with the bezel adhesive 104, and one bezel of the second-type sub-panel 1012 is provided with the bezel adhesive 104, that is, the bezel sealing area of the first-type sub-panel 1011 is greater than the bezel sealing area of the second-type sub-panel 1012. In this embodiment, the width of the seaming adhesive 107 extending between the first substrate 102 and the second substrate 103 corresponding to the second-type sub-panels 1012 is greater than the width of the seaming adhesive 107 extending between the first substrate 102 and the second substrate 103 corresponding to the first-type sub-panels 1011 so that the bezel sealing effects of the first sub-panel 1011 and the second sub-panel 1012 are kept consistent.

Figure 16:
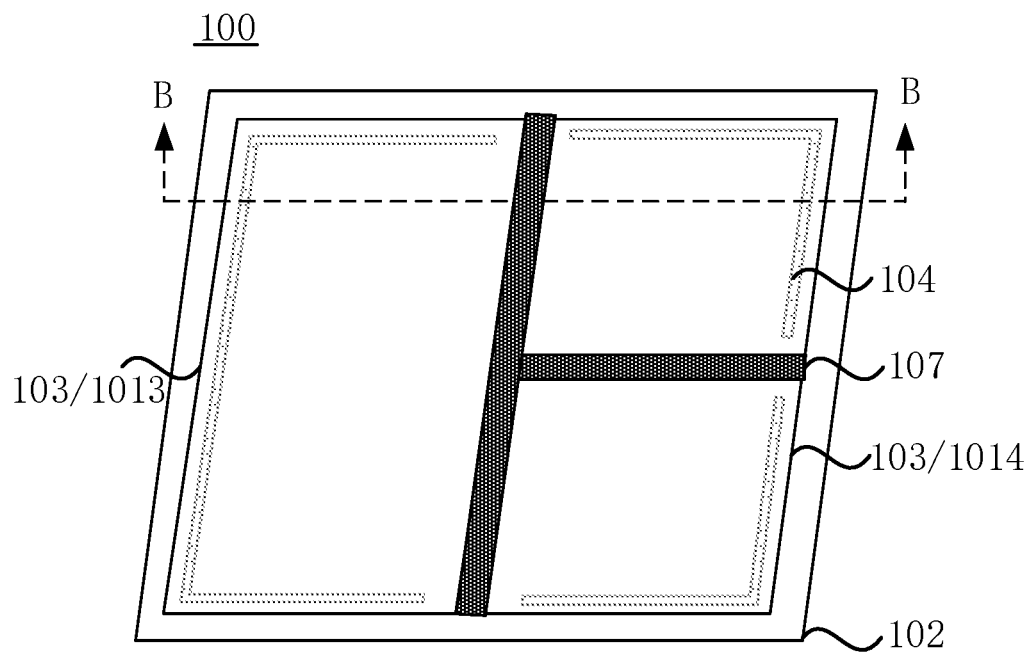
FIG. 16 is a top view of a display panel according to another embodiment of the present disclosure.
Figure 17:
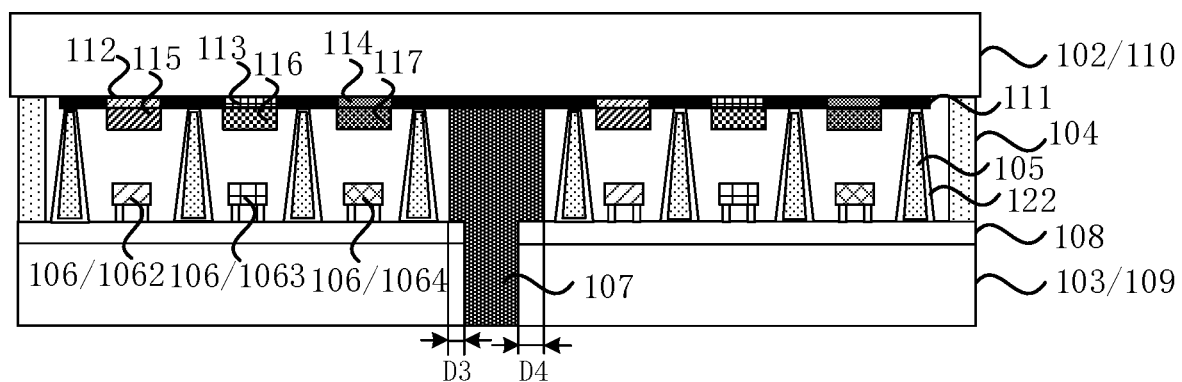
FIG. 17 is a sectional view taken along BB of FIG. 16.

In an embodiment, FIG. 16 is a top view of a display panel according to another embodiment of the present disclosure, and FIG. 17 is a sectional view taken along BB of FIG. 16. As shown in FIGS. 16 and 17, the sub-panels 101 include third-type sub-panels 1013 and fourth-type sub-panels 1014.

The area of each third-type sub-panel 1013 is greater than the area of each fourth-type sub-panel 1014.

The seaming adhesive 107 between the third-type sub-panels 1013 and the fourth-type sub-panels 1014 extends between the first substrate 102 and the plurality of second substrates 103.

In the direction parallel to the extension direction of the seaming adhesive 107 and parallel to the first substrate 102, the width of the seaming adhesive 107 extending between the first substrate 102 and the second substrate 103 corresponding to the third-type sub-panels 1013 is a third width D3; the width of the seaming adhesive 107 extending between the first substrate 102 and the second substrate 103 corresponding to the fourth-type sub-panels 1014 is a fourth width D4.

The third width D3 is greater than the fourth width D4.

By way of example, with continued reference to FIGS. 16 and 17, three bezels of the third-type sub-panel 1013 are provided with the bezel adhesive 104, and two bezels of the fourth-type sub-panel 1014 are provided with the bezel adhesive 104, that is, the bezel sealing area of the third-type sub-panel 1013 is greater than the bezel sealing area of the fourth-type sub-panel 1014, and thus the film layer in the third-type sub-panel 1013 has a lower risk of being damaged by external water and oxygen. In this embodiment, in the case where the splicing gaps between adjacent sub-panels 101 is constant, the width of the seaming adhesive 107 between the first substrate 102 and the second substrate 103 corresponding to the fourth-type sub-panel 1014 is increased as much as possible. In this manner, in the case where the external water and oxygen want to invade into the fourth-type sub-panel 1014 at the splicing gaps between adjacent sub-panels 101, the path into the fourth-type sub-panel 1014 become longer so that the risk of the organic material inside the fourth-type sub-panel 1014 being damaged by water and oxygen can be reduced, and thus the third-type sub-panel 1013 and the fourth-type sub-panel 1014 both have better sealing performance.

Figure 18:
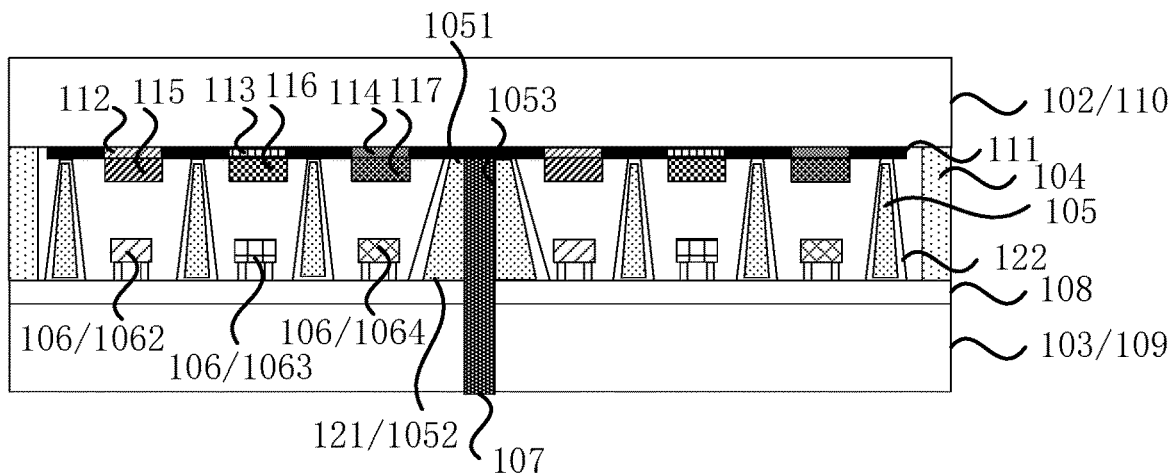
FIG. 18 is a structure diagram of a film layer of a display panel according to another embodiment of the present disclosure.

FIG. 18 is a structure diagram of a film layer of a display panel according to another embodiment of the present disclosure. As shown in FIG. 18, in an embodiment, a plurality of bank structures 105 include a plurality of first bank structures 121 located at the bezels of the plurality of second substrate 103; at least one first bank structure 121 includes a first surface 1051 closer to the first substrate 102, a second surface 1052 farther from the first substrate 102, and a third surface 1053 connected to the first surface 1051 and the second surface 1052.

The seaming adhesive 107 is disposed at the third surface 1053 of the first bank structure 121 between adjacent sub-panels 101, and the third surfaces 1053 all contact the seaming adhesive 107.

The seaming adhesive 107 is disposed at the third surface 1053 of the first bank structure 121 between adjacent sub-panels 101, and the third surfaces 1053 all contact the seaming adhesive 107. The seaming adhesive 107 directly contacts the third surfaces 1053 of the first bank structures 121 so that the bonding area between the seaming adhesive 107 and adjacent sub-panels 101 can be increased, which is conducive to improving the bonding effect between adjacent sub-panels 101 and the reliability of the display panel 100. At the same time, the sealing effect of the sub-panel 101 can be improved so that external water and oxygen can be prevented from entering the sub-panel 101 from the splicing gaps between adjacent sub-panels 101.

Figure 19:
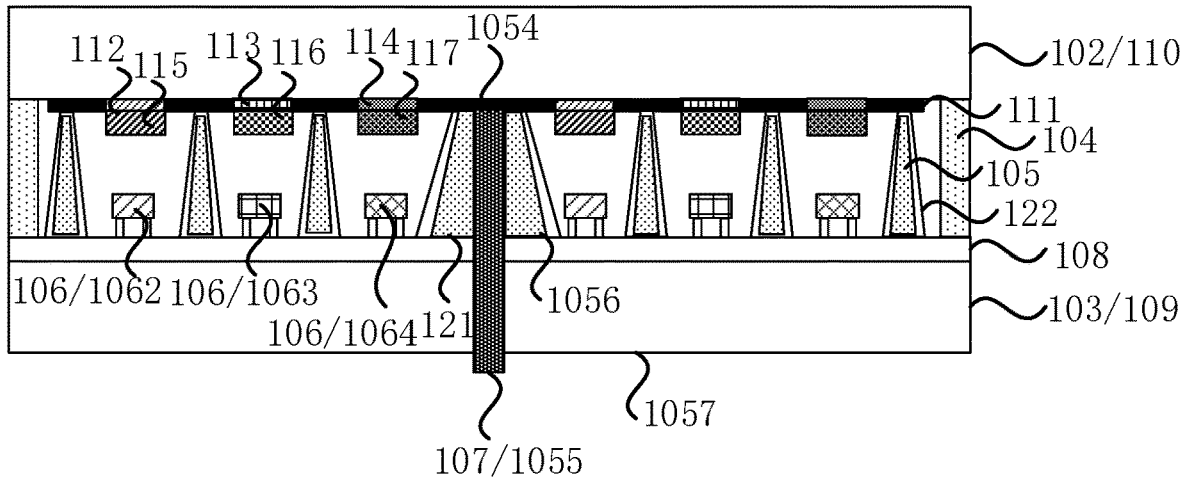
FIG. 19 is a structure diagram of a film layer of a display panel according to another embodiment of the present disclosure.

In an embodiment, FIG. 19 is a structure diagram of a film layer of a display panel according to another embodiment of the present disclosure. As shown in FIG. 19, the seaming adhesive 107 includes a fourth surface 1054 closer to the first substrate 101 and a fifth surface 1055 farther from the first substrate 101.

The second substrate 103 includes a sixth surface 1056 closer to the first substrate 102 and a seventh surface 1057 farther from the first substrate 102.

A distance from the fifth surface 1055 to the first substrate 102 is greater than a distance from the seventh surface 1057 to the first substrate 102.

The seaming adhesive 107 is disposed between the first bank structures 121 between adjacent sub-panels 101, and the distance from the fifth surface 1055 of the seaming adhesive 107 to the first substrate 102 may be greater than, less than, or equal to the distance from the seventh surface 1057 of the second substrate 103 to the first substrate 102. The case where the distance from the fifth surface 1055 of the seaming adhesive 107 to the first substrate 102 is greater than the distance from the seventh surface 1057 of the second substrate 103 to the first substrate 102, is conducive to ensuring the bonding area between the seaming adhesive 107 and the second substrate 103 and improving the bonding effect and the sealing effect between adjacent sub-panels 101.

Figure 20:
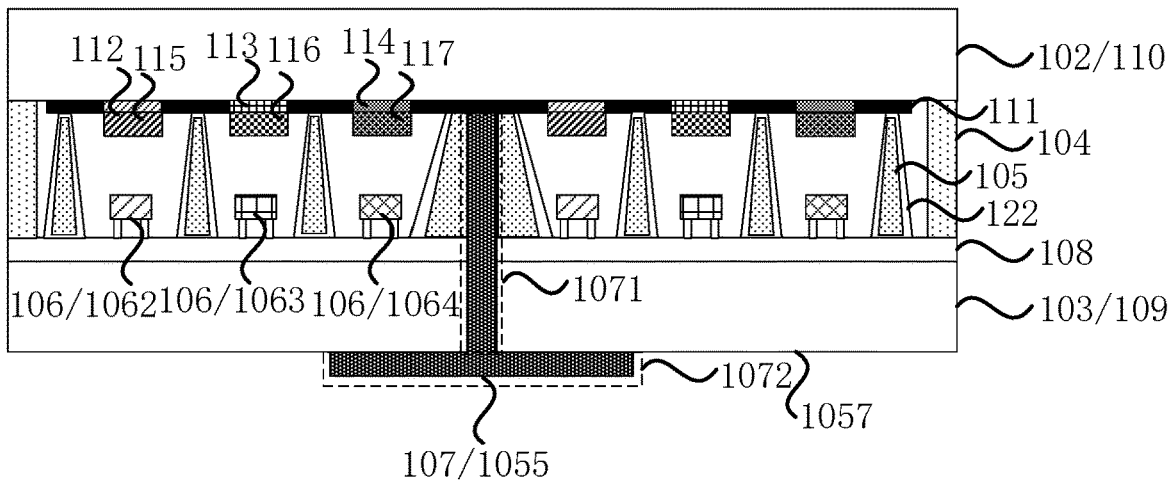
FIG. 20 is a structure diagram of a film layer of a display panel according to another embodiment of the present disclosure.

In an embodiment, FIG. 20 is a structure diagram of a film layer of a display panel according to another embodiment of the present disclosure. As shown in FIG. 20, the seaming adhesive 107 includes a first sub-section 1071 and a second sub-section 1072 that are arranged continuously; the first sub-section 1071 is located between adjacent sub-panels 101, and the second sub-section 1072 contacts the seventh surface 1057.

Along a direction parallel to the plane where the first substrate 102 is located, a width of the first sub-section 1071 is smaller than a width of the second sub-section 1072.

In this embodiment, the distance from the fifth surface 1055 of the seaming adhesive 107 to the first substrate 102 is greater than the distance from the seventh surface 1057 of the second substrate 103 to the first substrate 102, the seaming adhesive 107 includes the first sub-section 1071 and the second sub-section 1072 that are arranged continuously, and the second sub-section 1072 contacts the seventh surface 1057; moreover, along the direction parallel to the plane where the first substrate 102 is located, the width of the first sub-section 1071 is smaller than the width of the second sub-section 1072, and the bonding area between the second sub-section 1072 and the second substrates 103 of adjacent sub-panels 101 is significantly increased, so that the bonding force between adjacent sub-panels 101 is increased, which is conducive to improving the bonding effect and the sealing effect between adjacent sub-panels 101.

Figure 21:
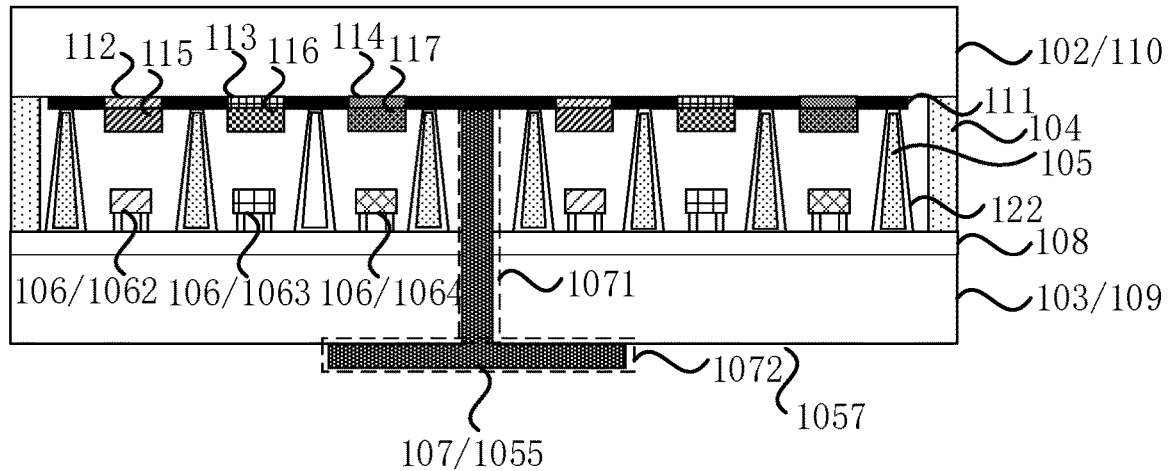
FIG. 21 is a structure diagram of a film layer of a display panel according to another embodiment of the present disclosure.

As another implementable manner, FIG. 21 is a structure diagram of a film layer of a display panel according to another embodiment of the present disclosure. As shown in FIG. 21, the difference from FIG. 20 is that the seaming adhesive 107 between adjacent sub-panels 101 does not directly contact the bank structures 105 between adjacent sub-panel 101.

Figure 22:
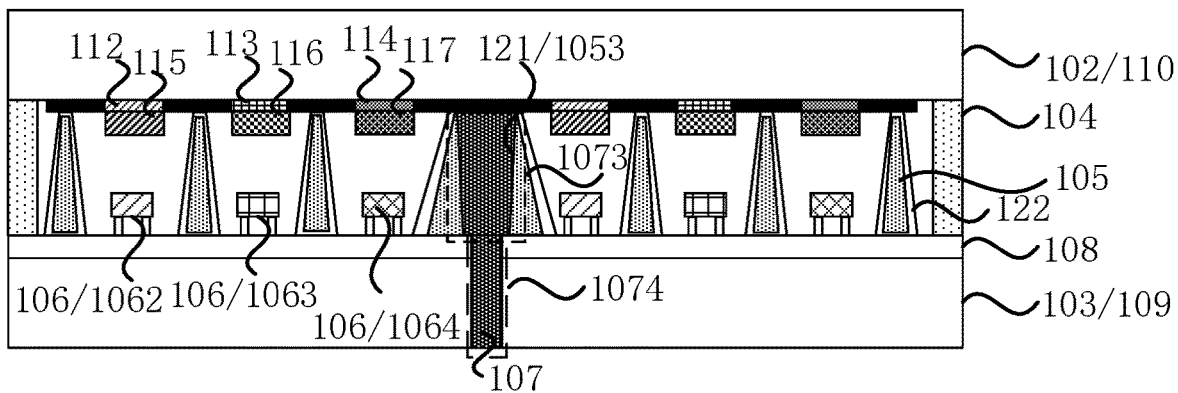
FIG. 22 is a structure diagram of a film layer of a display panel according to another embodiment of the present disclosure.

In an embodiment, FIG. 22 is a structure diagram of a film layer of a display panel according to another embodiment of the present disclosure. As shown in FIG. 22, along a direction from the first substrate 102 to the second substrate 103, the seaming adhesive 107 includes a third sub-section 1073 and a fourth sub-section 1074 that are arranged continuously.

The third sub-section 1073 is located between adjacent third surfaces 1053 of the first bank structures 121 of the sub-panels 101.

The fourth sub-section 1074 is located among the plurality of second substrates 103 of the sub-panels 101.

The sectional shape of the third sub-section 1073 is inverted trapezoid.

The third sub-section 1073 of the seaming adhesive 1071 directly contacts the third surface 1053 of the first bank structure 121 between adjacent sub-panels 101, and the sectional shape of the third sub-section 1073 of the seaming adhesive 107 is configured to be inverted trapezoid, which compared to a rectangular sectional shape, achieves a greater bonding area between the third sub-section 1073 of the seaming adhesive 107 and the third surfaces 1053 of the first bank structures 121 of adjacent sub-panels 101, and increases the bonding force between adjacent sub-panels 101.

Figure 23:
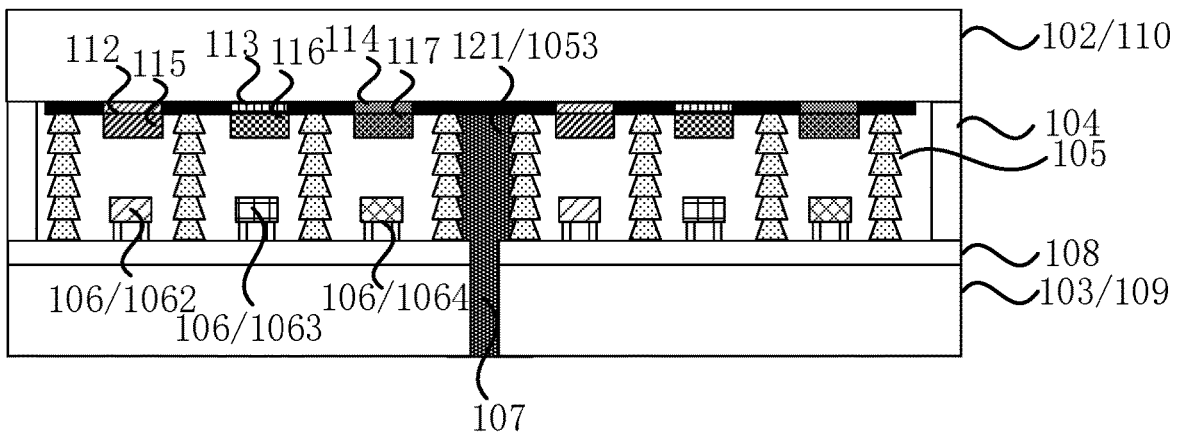
FIG. 23 is a structure diagram of a film layer of a display panel according to another embodiment of the present disclosure.

In an embodiment, FIG. 23 is a structure diagram of a film layer of a display panel according to another embodiment of the present disclosure. As shown in FIG. 23, the third surface 1053 is a rough and undulating surface.

The third surface 1053 of the first bank structure 121 between adjacent sub-panels 101 may be configured to be a rough and undulating surface. In this manner, the bonding area between the third surface 1053 and the seaming adhesive 107 is further increased, and thus the bonding force between adjacent sub-panels 101 is further increased. In an embodiment, a method for preparing the bank structures 105 in layers may be used so that the third surface 1053 is a rough and undulating surface.

Figure 24:
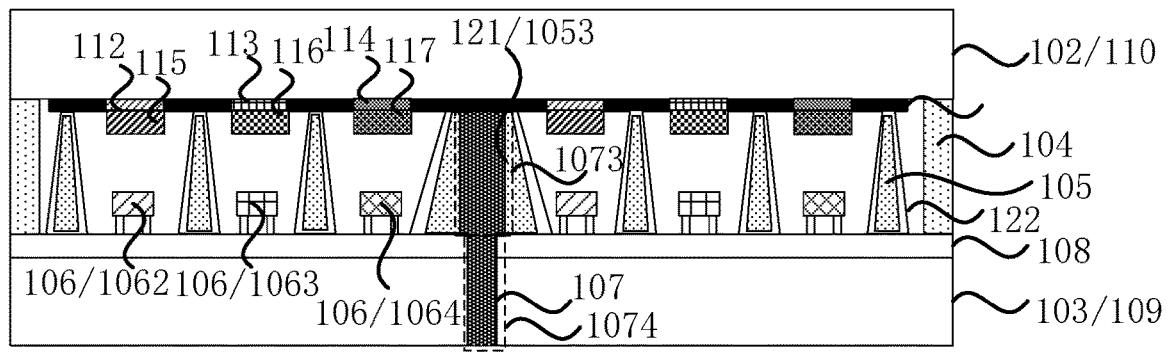
FIG. 24 is a structure diagram of a film layer of a display panel according to another embodiment of the present disclosure.

In an embodiment, FIG. 24 is a structure diagram of a film layer of a display panel according to another embodiment of the present disclosure. As shown in FIG. 24, the seaming adhesive 107 includes a third sub-section 1073 and a fourth sub-section 1074 that are arranged continuously.

The third sub-section 1073 is located between adjacent third surfaces 1053 of the first bank structures 121 of the sub-panels 101.

The fourth sub-section 1074 is located among the plurality of second substrates 103 of the sub-panels 101.

Along a direction parallel to the first substrate 101, the width of the third sub-section 1073 is greater than the width of the fourth sub-section 1074.

The third sub-section 1073 is located between adjacent third surface 1053 of the first bank structures 121 of the sub-panels 101, and the third sub-section 1073 directly contacts the third surface 1053; and at the same time, along the direction parallel to the first substrate 102, the width of the third sub-section 1073 is greater than the width of the fourth sub-section 1074, which increase the bonding area between the seaming adhesive 107 and the first bank structures 121 and the bonding area between the first substrate 102 and the second substrate 103, and increase the bonding force between adjacent sub-panels 101.

In an embodiment, the sub-panel 101 further includes a reflective layer 122 located on a surface of the bank structure 105.

The reflective layer 122 is not disposed between the seaming adhesive 107 disposed at the third surface 1053 of the first bank structure 121 between adjacent sub-panels 101 and the third surface 1053.

With continued reference to FIG. 24 and the like, the reflective layer 122 is disposed on the surface of the bank structure 105, and the reflective layer 122 may improve the light efficiency of the light emitted by the light-emitting elements 106 through the quantum dots. However, the reflective layer 122 is not disposed between the seaming adhesive 107 disposed at the third surface 1053 of the first bank structure 121 between adjacent sub-panels 101 and the third surface 1053, so that the bank structures 105 directly contact the seaming adhesive 107. Since the bank structure 105 and the seaming adhesive 107 are both organic materials, the reflective layer 122 is not disposed between the seaming adhesive 107 disposed at the third surface 1053 of the first bank structure 121 between adjacent sub-panels 101 and the third surface 1053, so that the bonding force between the bank structures 105 and the seaming adhesive 107 can be increased, and thus the bonding effect between adjacent sub-panels 101 can be ensured.

Figure 25:
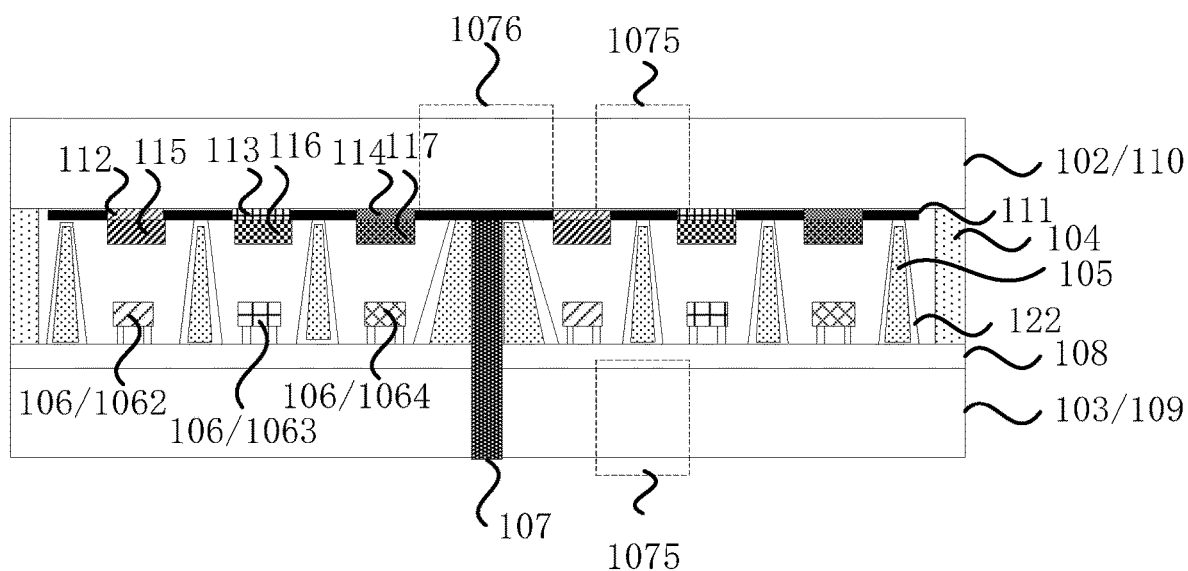
FIG. 25 is a structure diagram of a film layer of a display panel according to another embodiment of the present disclosure.

In an embodiment, FIG. 25 is a structure diagram of a film layer of a display panel according to another embodiment of the present disclosure. As shown in FIG. 25, the sub-panel 101 includes a plurality of sub-pixels.

The first substrate 102 includes a fifth sub-section 1075 and a sixth sub-section 1076.

The fifth sub-section 1075 is located between vertical projections of two adjacent sub-pixels in the same sub-panel 101 on the plane where the first substrate 102 is located.

The sixth sub-section 1076 is located between vertical projections of two adjacent sub-pixels in two different sub-panels 101 on the plane where the first substrate 102 is located.

The elastic modulus of the fifth sub-section 1075 is less than the elastic modulus of the sixth sub-section 1076.

In the stretchable display panel 100, the display region 1021 is also stretchable, and the sub-panels 101 are also stretchable. The stretchable position of the display region 1021 is, for example, the position of the first substrate 102 between two adjacent sub-pixels in the same sub-panel 101 and the position of the second substrate 103 between two adjacent sub-pixels in the same sub-panel 101, that is, the fifth sub-section 1075 in FIG. 25. The elastic modulus of this region is changed so that the display region 1021 is stretchable. Since the seaming adhesive 107 corresponds to a region provided with only one substrate (i.e., the first substrate 102), and corresponds a region being the sixth sub-section 1076 in FIG. 25, and other places are filled with organic glue, the elastic modulus thereof is relatively small, and the flexibility thereof is relatively great. In a case where same stretch is subjected to, the sixth sub-section 1076 is more stretched than the fifth sub-section 1075. In this manner, the gap becomes greater so that the display is affected. Therefore, in this embodiment, the elastic modulus of the sixth sub-section 1076 is greater than the elastic modulus of the fifth sub-section 1075 so that in a case where same stretch is subjected to, the deformation of the sixth sub-section 1076 is same as the deformation of the fifth sub-section 1075. For example, by lengthen the curing time of the seaming adhesive 107, or by curing and doping the sixth sub-section 1076, the elastic modulus of the sixth sub-section 1076 becomes greater.

Based on a same inventive concept, embodiments of the present disclosure further provide a preparation method of a display panel, or that is to say, the display panel provided in the preceding embodiments can be formed by using the preparation method of a display panel so that the preparation method of a display panel also has the beneficial effects of the display panel, and the same parts can be understood by referring to the above explanation of the display panel and will not be described again hereinafter.

Figure 26:
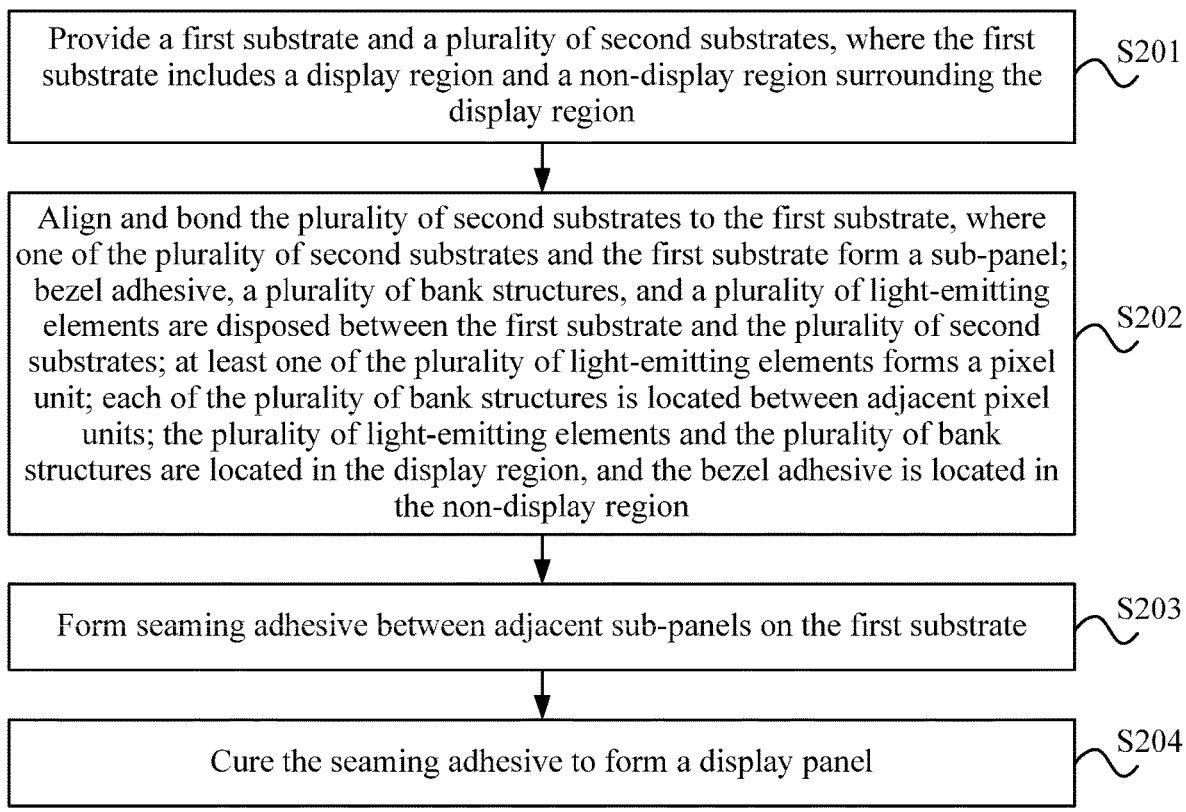
FIG. 26 is a flowchart of a preparation method of a display panel according to an embodiment of the present disclosure.

By way of example, FIG. 26 is a flowchart of a preparation method of a display panel according to an embodiment of the present disclosure. Referring to FIG. 26, the preparation method of a display panel includes the steps described below.

In S201, a first substrate and a plurality of second substrates are provided, where the first substrate includes a display region and a non-display region surrounding the display region.

A substrate provided with bank structures may serve as the first substrate, and A substrate provided with light-emitting elements may serve as the second substrate; or the substrate provided with a plurality of light-emitting elements may serve as the first substrate, and the substrate provided with the bank structures may serve as the second substrate. In any one of the preceding combinations, an area of the first substrate is greater than an area of the second substrate, and the second substrate is disposed in a display region of the first substrate so that the display effect can be ensured.

In S202, the plurality of second substrates are aligned and bonded to the first substrate, where one of the plurality of second substrates and the first substrate form a sub-panel; bezel adhesive, a plurality of bank structures, and a plurality of light-emitting elements are disposed between the first substrate and the plurality of second substrates; at least one of the plurality of light-emitting elements forms a pixel unit; each of the plurality of bank structures is located between adjacent pixel units; the plurality of light-emitting elements and the plurality of bank structures are located in the display region, and the bezel adhesive is located in the non-display region.

The bezel adhesive is usually disposed in the non-display region through a screen printing process or a coating process, and a width of the bezel adhesive is usually set between 0.1 to 2 mm so that the bonding effect between the first substrate and the second substrates can be ensured. The bank structures are configured to prevent crosstalk among lights emitted by adjacent light-emitting elements.

In S203, seaming adhesive is formed between adjacent sub-panels on the first substrate.

The seaming adhesive is located between adjacent sub-panels and is used to fill the splicing gaps between adjacent sub-panels. The splicing gaps between adjacent sub-panels is usually 0.5 to 5 mm. The smaller the splicing gap is, the better the display effect of the display panel is.

In S204, the seaming adhesive is cured to form a display panel.

The seaming adhesive may be cured and molded by ultraviolet light or natural light, the material of the seaming adhesive may be acrylic glue, and only the natural light is needed to cure and mold the seaming adhesive so that the manufacturing process costs can be reduced.

The display panel shown in FIG. 1 in the preceding embodiments may be prepared by using the preparation method of a display panel. Through this method, the area of the display region of the display panel occupied by the bezel adhesive can be reduced, the splicing gaps between the sub-panels can be reduced, and thus the continuity of the display picture and the splicing effect of the display panel can be ensured.

Figure 27:
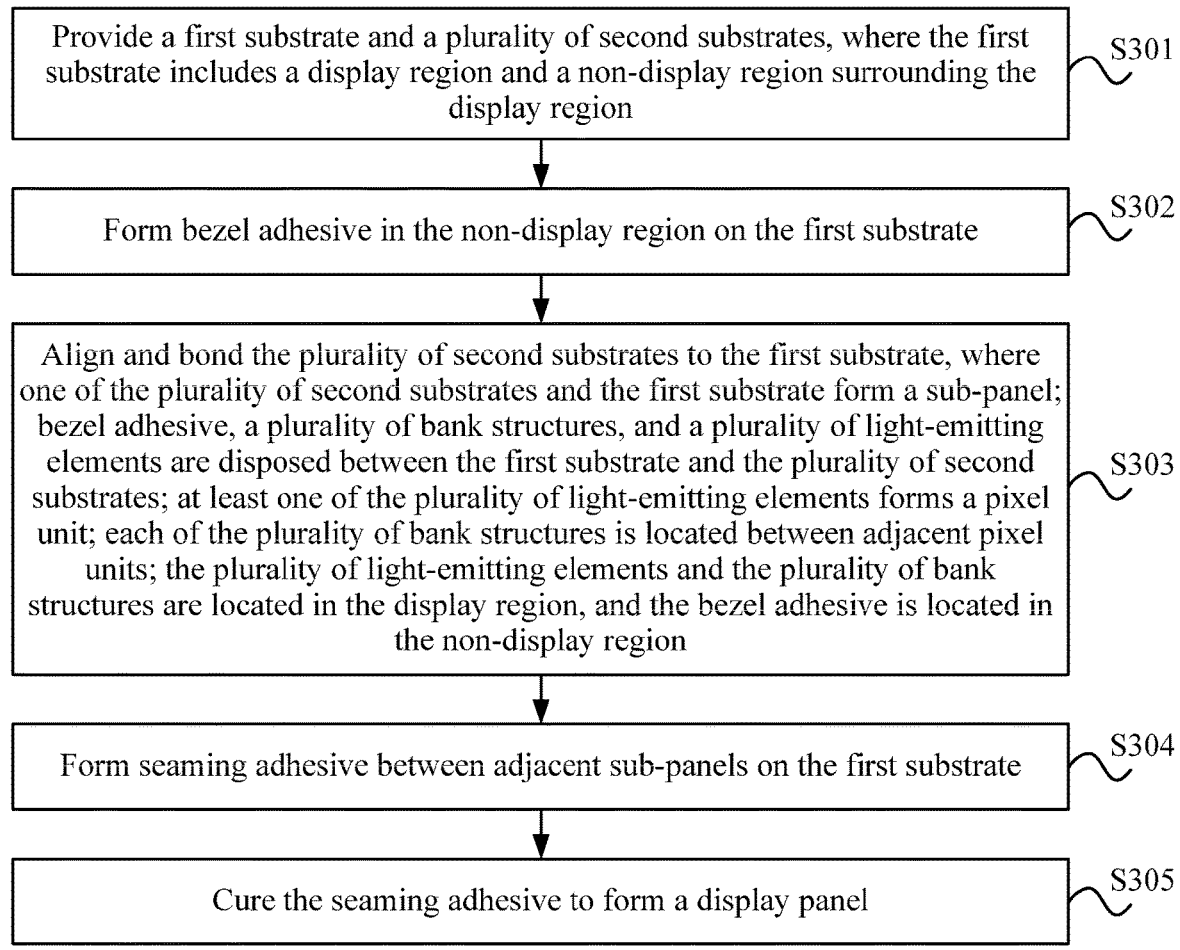
FIG. 27 is a flowchart of a preparation method of a display panel according to another embodiment of the present disclosure.
Figure 28:
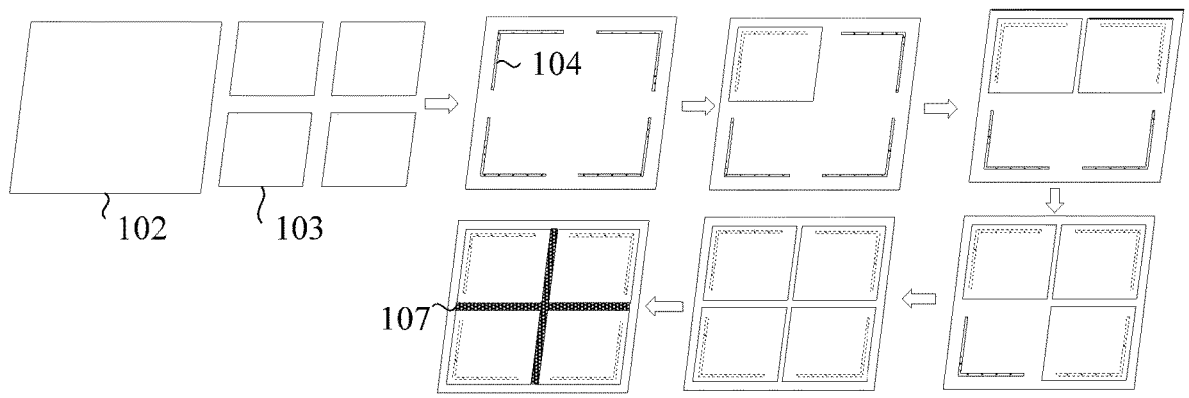
FIG. 28 is a process flowchart of a preparation method of a display panel according to another embodiment of the present disclosure.

In an embodiment, FIG. 27 is a flowchart of a preparation method of a display panel according to another embodiment of the present disclosure, and FIG. 28 is a process flowchart of a preparation method of a display panel according to another embodiment of the present disclosure. By way of example, the plurality of sub-panels form an array structure of two rows and two columns are illustrated for explanation. Referring to FIGS. 27 and 28, the preparation method of a display panel may include the steps described below.

In S301, a first substrate and a plurality of second substrates are provided, where the first substrate includes a display region and a non-display region surrounding the display region.

In S302, bezel adhesive is formed in the non-display region on the first substrate.

The bezel adhesive is formed in the non-display region of the first substrate, that is, the bezel adhesive may be formed by a one-step process so that the process steps can be simplified, and thus the preparation efficiency of the display panel can be improved. In an embodiment, the bezel adhesive may be a closed ring structure or a non-closed ring structure. In the case where the bezel adhesive 104 is a closed ring structure, each sub-panel 101 has good sealing performance, and thus external water and oxygen can be prevented from affecting quantum dots or bank structures composed of the organic material inside the sub-panel 101. In FIG. 28, the case where the bezel adhesive is a closed loop structure is used as an example for description.

In S303, the plurality of second substrates are aligned and bonded to the first substrate, where one of the plurality of second substrates and the first substrate form a sub-panel; bezel adhesive, a plurality of bank structures, and a plurality of light-emitting elements are disposed between the first substrate and the plurality of second substrates; at least one of the plurality of light-emitting elements forms a pixel unit; each of the plurality of bank structures is located between adjacent pixel units; the plurality of light-emitting elements and the plurality of bank structures are located in the display region, and the bezel adhesive is located in the non-display region.

The first substrate and the second substrate may be manufactured independently in the process of preparation, and the first substrate is aligned and bonded to the second substrate after their respective preparations are completed.

In S304, seaming adhesive is formed between adjacent sub-panels on the first substrate.

In S305, the seaming adhesive is cured to form a display panel.

Figure 29:
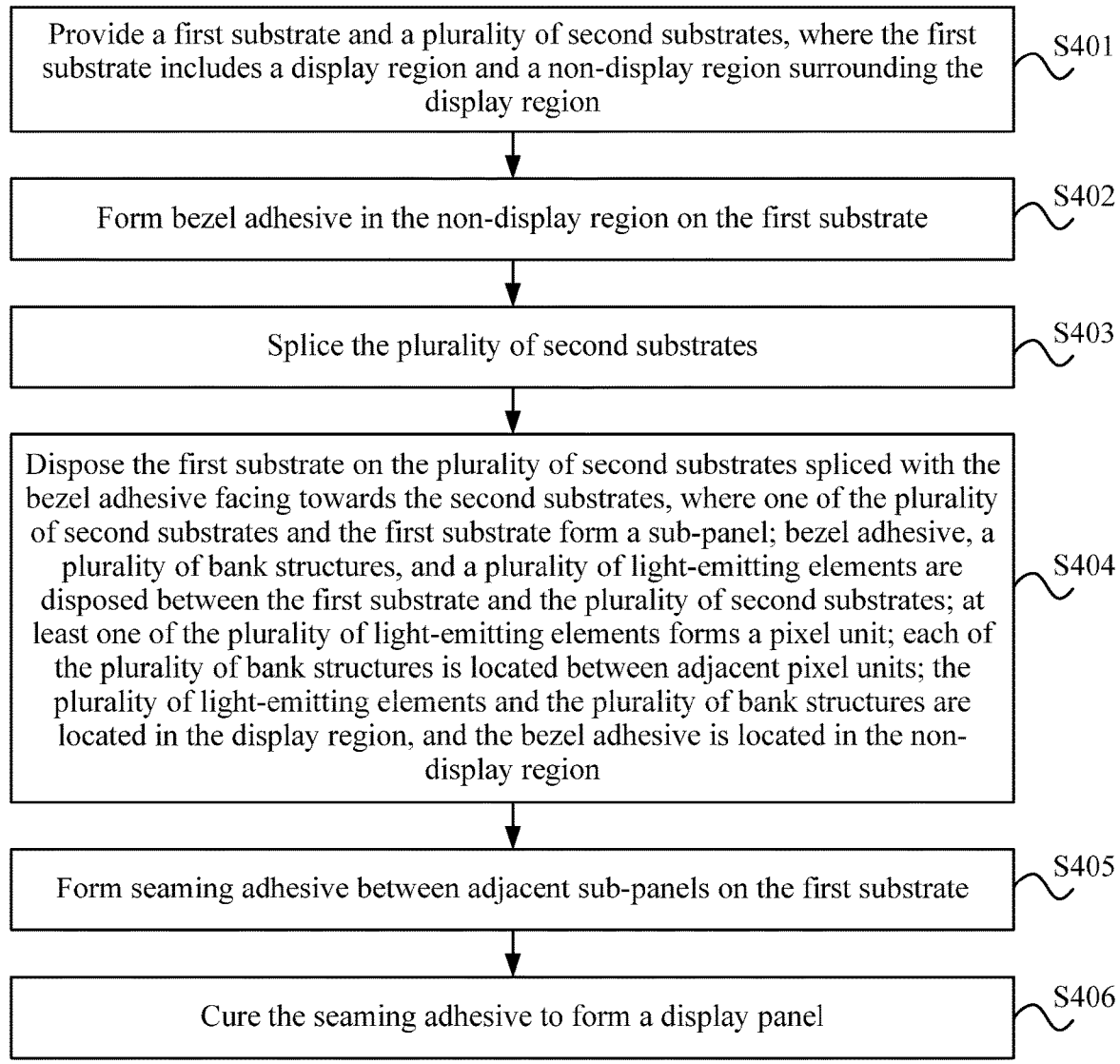
FIG. 29 is a flowchart of a preparation method of a display panel according to another embodiment of the present disclosure.
Figure 30:
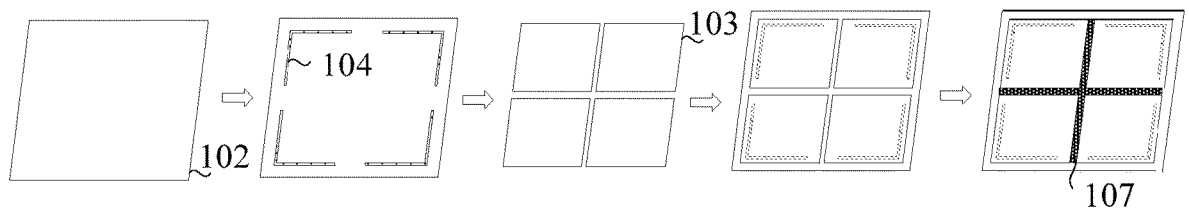
FIG. 30 is a process flowchart of a preparation method of a display panel according to another embodiment of the present disclosure.

In an embodiment, FIG. 29 is a flowchart of a preparation method of a display panel according to another embodiment of the present disclosure, and FIG. 30 is a process flowchart of a preparation method of a display panel according to another embodiment of the present disclosure. Referring to FIGS. 29 and 30, the preparation method of a display panel may include the steps described below.

In S401, a first substrate and a plurality of second substrates are provided, where the first substrate includes a display region and a non-display region surrounding the display region.

In S402, bezel adhesive is formed in the non-display region on the first substrate.

In S403, the plurality of second substrates are spliced.

A plurality of second substrates are pattern-spliced according to actual needs, and the sizes of all of or part of the plurality of second substrates may be the same. Compared with the preceding preparation methods, in which, when the second substrates are aligned and bonded to the first substrate, the alignment accuracy in three directions of a horizontal direction, a vertical direction, and a height direction needs to be considered; in the present embodiment, when a plurality of second substrates are spliced, only the alignment accuracy in the horizontal direction and the vertical direction of each second substrate needs to be considered, so that the difficulty of splicing can be effectively reduced.

In S404, the first substrate is disposed on the plurality of second substrates spliced with the bezel adhesive facing towards the second substrates, where one of the plurality of second substrates and the first substrate form a sub-panel; bezel adhesive, a plurality of bank structures, and a plurality of light-emitting elements are disposed between the first substrate and the plurality of second substrates; at least one of the plurality of light-emitting elements forms a pixel unit; each of the plurality of bank structures is located between adjacent pixel units; the plurality of light-emitting elements and the plurality of bank structures are located in the display region, and the bezel adhesive is located in the non-display region.

The plurality of second substrates are spliced, and since the area of the first substrate is greater than the area of the second substrate, the first substrate provided with the bezel adhesive is aligned and bonded to the plurality of second substrates spliced. During the process of aligning and bonding, it is ensured that each bank structure is located between adjacent pixel units so that crosstalk among lights emitted by the light-emitting elements can be prevented.

In S405, seaming adhesive is formed between adjacent sub-panels on the first substrate.

In S406, the seaming adhesive is cured to form a display panel.

Figure 31:
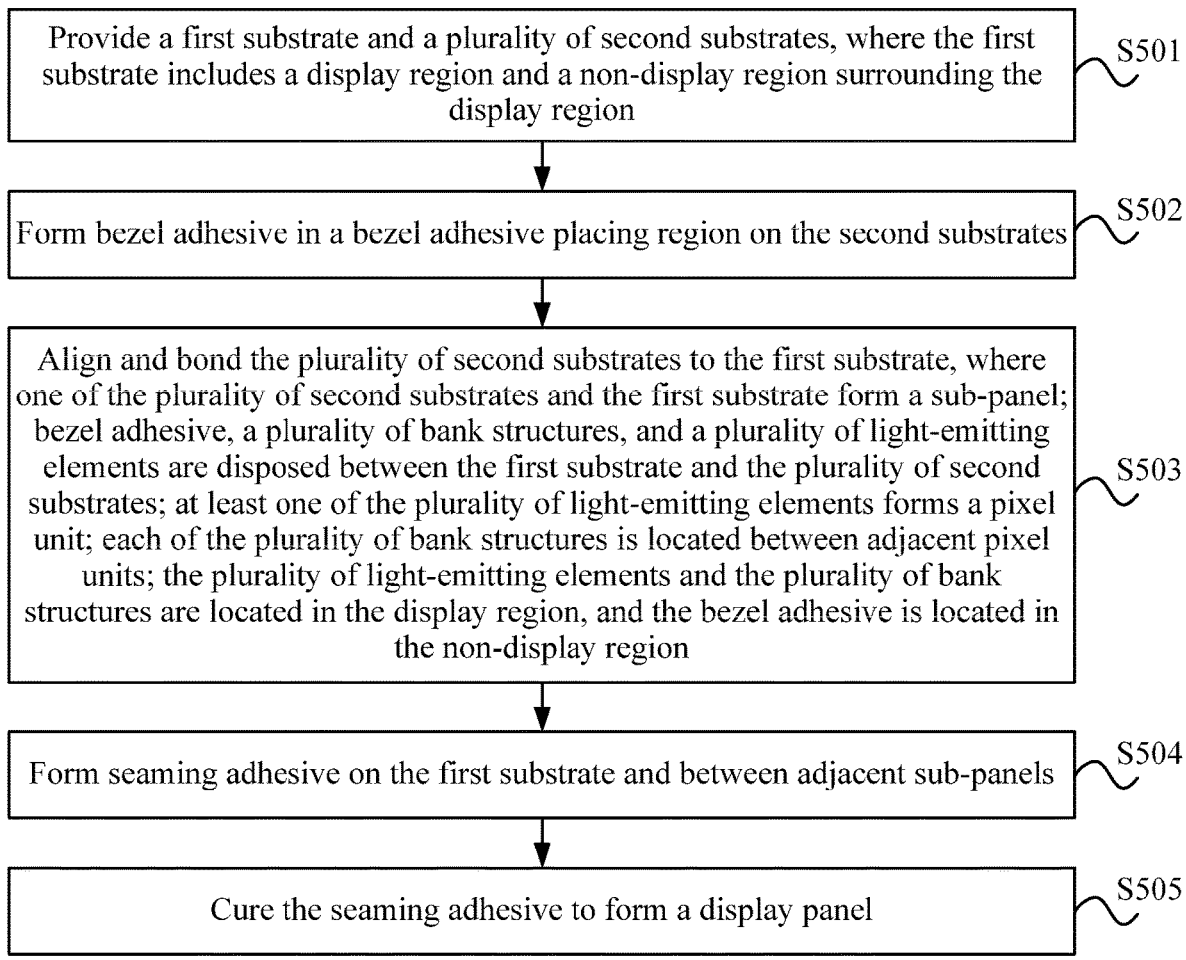
FIG. 31 is a flowchart of a preparation method of a display panel according to another embodiment of the present disclosure.

In an embodiment, FIG. 31 is a flowchart of a preparation method of a display panel according to another embodiment of the present disclosure. As shown in FIG. 31, each of at least part of the second substrates includes a bezel adhesive placing region, and the non-display region includes the bezel adhesive placing region. The preparation method of a display panel may include the steps described below.

In S501, a first substrate and a plurality of second substrates are provided, where the first substrate includes a display region and a non-display region surrounding the display region.

In S502, bezel adhesive is formed in a bezel adhesive placing region on the second substrates.

In S503, the plurality of second substrates are aligned and bonded to the first substrate, where one of the plurality of second substrates and the first substrate form a sub-panel; bezel adhesive, a plurality of bank structures, and a plurality of light-emitting elements are disposed between the first substrate and the plurality of second substrates; at least one of the plurality of light-emitting elements forms a pixel unit; each of the plurality of bank structures is located between adjacent pixel units; the plurality of light-emitting elements and the plurality of bank structures are located in the display region, and the bezel adhesive is located in the non-display region.

In S504, seaming adhesive is formed between adjacent sub-panels on the first substrate.

In S505, the seaming adhesive is cured to form a display panel.

The bezel adhesive is disposed in the bezel adhesive placing region on the second substrates, the second substrates provided with the bezel adhesive are aligned and bonded to the first substrate, the splicing gaps between adjacent second substrates is controlled, and the splicing gaps between adjacent second substrates is filled with the seaming adhesive so that the display effect and sealing performance of the display panel can be ensured.

Figure 32:
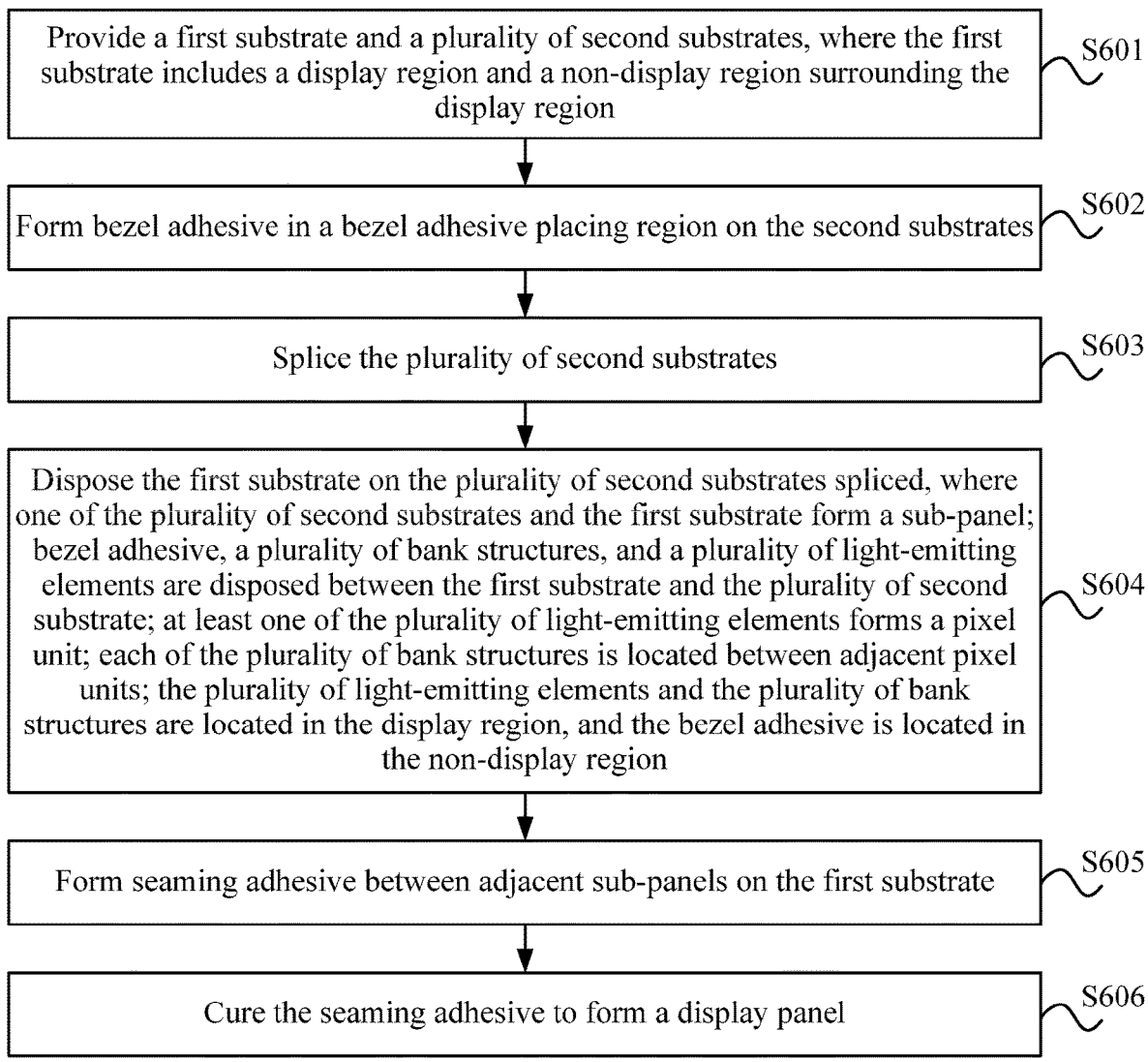
FIG. 32 is a flowchart of a preparation method of a display panel according to another embodiment of the present disclosure.
Figure 33:
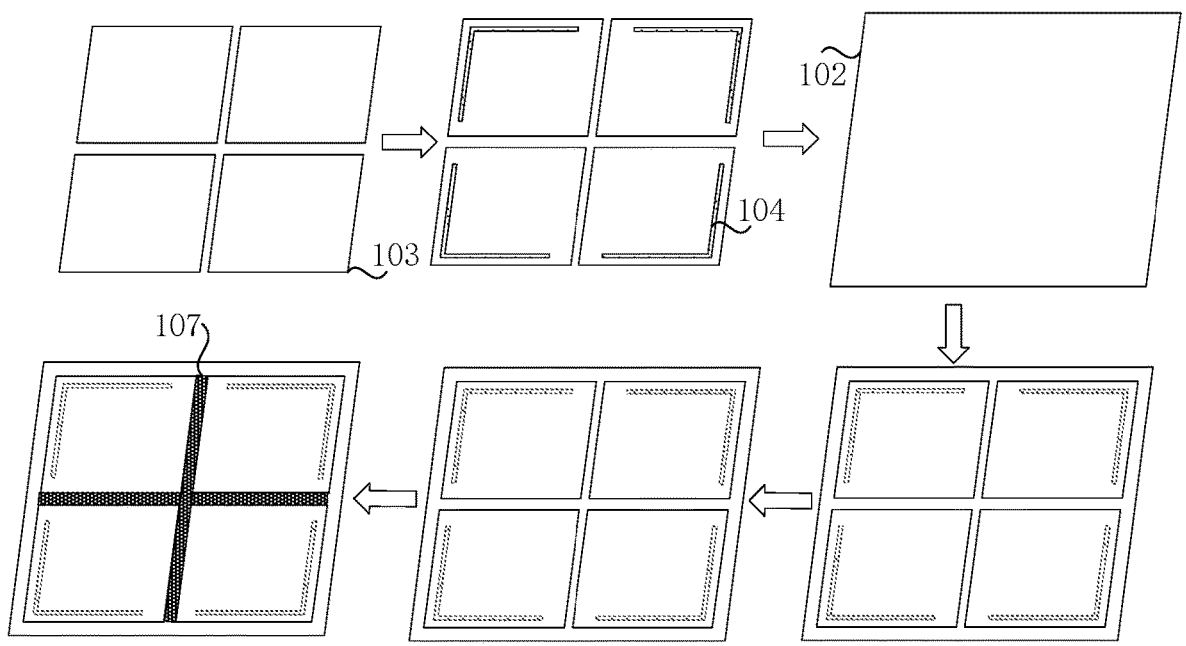
FIG. 33 is a process flowchart of a preparation method of a display panel according to another embodiment of the present disclosure.

In an embodiment, FIG. 32 is a flowchart of a preparation method of a display panel according to another embodiment of the present disclosure, and FIG. 33 is a process flowchart of a preparation method of a display panel according to another embodiment of the present disclosure. By way of example, as shown in FIGS. 32 and 33, a plurality of sub-panels forming an array structure of two rows and two columns are illustrated for explanation. Each of at least part of the second substrates includes a bezel adhesive placing region, and the non-display region includes the bezel adhesive placing region. The preparation method of a display panel may include the steps described below.

In S601, a first substrate and a plurality of second substrates are provided, where the first substrate includes a display region and a non-display region surrounding the display region.

In S602, bezel adhesive is formed in the bezel adhesive placing region on the second substrates.

In S603, the plurality of second substrates are spliced.

In S604, the first substrate is disposed on the plurality of second substrates spliced, where one of the plurality of second substrates and the first substrate form a sub-panel; bezel adhesive, a plurality of bank structures, and a plurality of light-emitting elements are disposed between the first substrate and the plurality of second substrates; at least one of the plurality of light-emitting elements forms a pixel unit; each of the plurality of bank structures is located between adjacent pixel units; the plurality of light-emitting elements and the plurality of bank structures are located in the display region, and the bezel adhesive is located in the non-display region.

In S605, seaming adhesive is formed between adjacent sub-panels on the first substrate.

The seaming adhesive is located between adjacent sub-panels and is used to fill the splicing gaps between adjacent sub-panels. The smaller the splicing gaps between adjacent sub-panels is, the better the display effect of the display panel is.

In S606, the seaming adhesive is cured to form a display panel.

The bezel adhesive is disposed in the bezel adhesive placing region on the second substrates, the second substrates provided with the bezel adhesive are aligned and bonded to the first substrate, and the second substrates are spliced so that an array structure is formed according to actual needs. When the second substrates are spliced, only the alignment accuracy in the horizontal direction and the vertical direction of each second substrate needs to be considered, and the first substrate is disposed on the plurality of second substrates spliced so that the difficulty of splicing can be effectively reduced. Moreover, the splicing gaps between adjacent second substrates are filled with the seaming adhesive so that the display effect and sealing performance of the display panel can be ensured.

Figure 34:
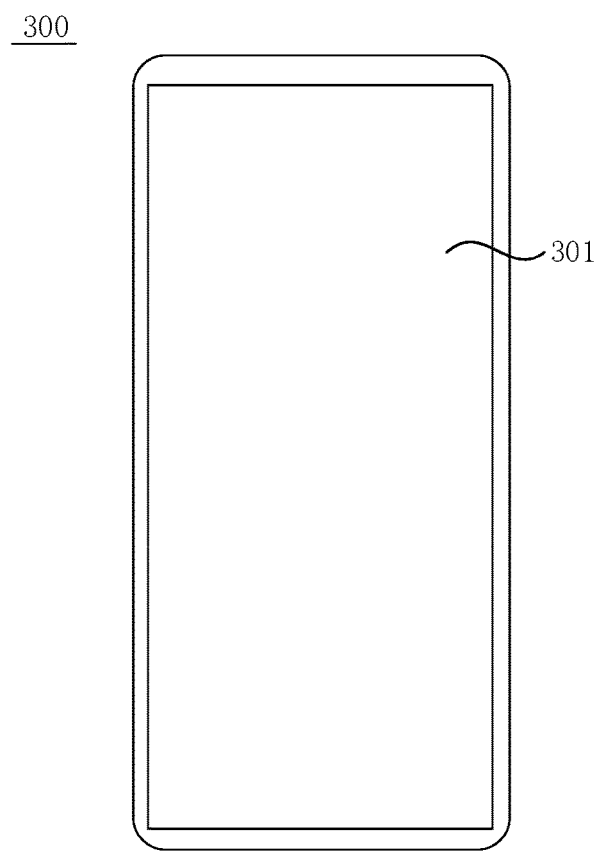
FIG. 34 is a structure diagram of a display device according to an embodiment of the present disclosure.

Embodiments of the present disclosure further provide a display device. The display device includes any display panel of the preceding embodiments. By way of example, as shown in FIG. 34, a display device 300 includes a display panel 301. Therefore, the display device also has the beneficial effects of the display panel described in the preceding embodiments, and for the same details, reference may be made to the description of the preceding display panel, and repetition will not made herein.

The display device 300 provided in embodiments of the present disclosure may be the phone shown in FIG. 34, or may be any electronic product with a display function, including but not limited to: televisions, laptops, desktop displays, tablet computers, digital cameras, smart bracelets, smart glasses, in-vehicle displays, industry-controlling equipment, medical displays, touch interactive terminals, etc., which will not be limited in embodiments of the present disclosure.

It is to be noted that the preceding are only preferred embodiments of the present disclosure and the technical principles used therein. It is to be understood by those skilled in the art that the present disclosure is not limited to the embodiments described herein. For those skilled in the art, various apparent modifications, adaptations, combinations, and substitutions can be made without departing from the scope of the present disclosure. Therefore, while the present disclosure has been described in detail via the preceding embodiments, the present disclosure is not limited to the preceding embodiments and may include more equivalent embodiments without departing from the inventive concept of the present disclosure. The scope of the present disclosure is determined by the scope of the appended claims.

What is claimed is:

1. A display panel, comprising:
a plurality of sub-panels, wherein each of the plurality of sub-panels comprises a first substrate, a second substrate, bezel adhesive located between the first substrate and the second substrate, a plurality of bank structures, and a plurality of light-emitting elements; at least one of the plurality of light-emitting elements forms a pixel unit; and each of the plurality of bank structures is located between adjacent pixel units; and
seaming adhesive located between adjacent sub-panels of the plurality of sub-panels,
wherein the plurality of sub-panels share a same first substrate, and the seaming adhesive is disposed on the same first substrate;
wherein the first substrate comprises a display region and a non-display region surrounding the display region, the plurality of light-emitting elements and the plurality of bank structures are located in the display region, and the bezel adhesive is located in the non-display region; and
wherein the plurality of sub-panels form an array structure of M rows and N columns;
the plurality of sub-panels comprise first-type sub-panels and second-type sub-panels;
the first-type-sub-panels refers to sub-panels located in a first row and a first column of the array structure sub-panels located in the first row and an N-th column of the array structure subpanels located in an M-th row and the first column of the array structure, and sub-panels located in the M-th row and the N-th column of the array structure;
the second-type sub-panels refers to sub-panels in the plurality of sub-panels other than the first-type sub-panels;
bezel adhesive of each of the first-type sub-panels is located on two bezels of the each of the first-type sub-panels; and
bezel adhesive of each of the second-type sub-panels is located on one bezel of the each of the second-type sub-panels,
wherein M and N are both positive integers, M=2, and N≥2; or
M and N a both integers, N=2, and M≥2.

2. The display panel of claim 1, wherein the bezel adhesive is disposed on the first substrate; and
wherein the bezel adhesive forms a closed ring structure.

3. The display panel of claim 1, wherein each of the plurality of sub-panels further comprises a flexible circuit board, and the non-display region comprises a first non-display region and a second non-display region; and the display panel comprises the plurality of sub-panels in two rows and N columns, a flexible circuit board of one of the plurality of sub-panels in a first row is bound to the first non-display region, and the first non-display region is the non-display region on a side of the plurality of sub-panels in the first row farther from the plurality of sub-panels in a second row; a flexible circuit board of the one of the plurality of sub-panels in the second row is bound to the second non-display region, and the second non-display region is the non-display region on a side of the plurality of sub-panels in the second row farther from the plurality of sub-panels in the first row; or the display panel comprises The plurality of sub-panels in M rows and two columns, a flexible circuit board of one of the plurality of sub-panels in a first column is bound to a third non-display region, and the third non-display region is the non-display region on a side of the plurality of sub-panels in the first column farther from the plurality of sub-panels in a second column: a flexible circuit board of the one of the plurality of sub-panels in the second column is bound to a fourth non-display region, and the fourth non-display region is the non-display region on a side of the plurality of sub-panels in the second column farther from the plurality of sub-panels in the first column.

4. The display panel of claim 1, wherein
the seaming adhesive between the first-type sub-panels and the second-type sub-panels extends between the first substrate and the plurality of second substrates; and
in a direction parallel to an extension direction of the seaming adhesive and parallel to the first substrate, a width of the seaming adhesive extending between the first substrate and the second substrate corresponding to the first-type sub-panels is a first width; a width of the seaming adhesive extending between the first substrate and the second substrate corresponding to the second-type sub-panels is a second width, and
wherein the first width is less than the second width.

5. The display panel of claim 1, wherein
the plurality of sub-panels comprise third-type sub-panels and fourth-type sub-panels;
an area of each of the third-type sub-panels is greater than an area of each of the fourth-type sub-panels;
the seaming adhesive between the third-type sub-panels and the fourth-type sub-panels extends between the first substrate and the plurality of second substrates; and
wherein in a direction parallel to an extension direction of the seaming adhesive and parallel to the first substrate, a width of the seaming adhesive extending between the first substrate and the second substrate corresponding to the third-type sub-panels is a third width; a width of the seaming adhesive extending between the first substrate and the second substrate corresponding to the fourth-type sub-panels is a fourth width, and
wherein the third width is greater than the fourth width.

6. A display panel, comprising:
a plurality of sub-panels wherein each of the plurality of sub-panels comprises a first substrate, a second substrate, bezel adhesive located between the first substrate and the second substrate, a plurality of bank structures, and a plurality of light-emitting elements; at least one of the plurality of light-emitting elements forms a pixel unit; and each of the plurality of bank structures is located between adjacent pixel units; and seaming adhesive located between adjacent sub-panels of the plurality of sub-panels,
wherein the plurality of sub-panels share a same first substrate, and the seaming adhesive is disposed on the same first substrate;
wherein the first substrate comprises a display region and a non-display region surrounding the display region, the plurality of light-emitting elements and the plurality of bank structures are located in the display region, and the bezel adhesive is located in the non-display region; and
wherein the plurality of bank structures comprise a plurality of first bank structures located at a bezel of the second substrate: at least one of the plurality of first bank structures comprises a first surface closer to the first substrate, a second surface farther from the first substrate, and a third surface connected to the first surface and the second surface; and
the seaming adhesive is disposed at the third surfaces of the plurality of first bank structures between adjacent sub-panels of the plurality of sub-panels, and the third surfaces all contact the seaming adhesive.

7. The display panel of claim 6, wherein
the seaming adhesive comprises a fourth surface closer to the first substrate and a fifth surface farther from the first substrate;
the second substrate comprises a sixth surface closer to the first substrate and a seventh surface farther from the first substrate; and
a distance from the fifth surface to the first substrate is greater than a distance from the seventh surface to the first substrate.

8. The display panel of claim 7, wherein the seaming adhesive comprises a first sub-section and a second sub-section that are arranged continuously; the first sub-section is located between adjacent sub-panels of the plurality of sub-panels, and the second sub-section contacts the seventh surface; and
along a direction parallel to the plane where the first substrate is located, a width of the first sub-section is less than a width of the second sub-section.

9. The display panel of claim 6, wherein along a direction from the first substrate to the second substrate, the seaming adhesive comprises a third sub-section and a fourth sub-section that are arranged continuously:
the third sub-section is located between adjacent third surfaces of first bank structures of the plurality of first bank structures of the sub-panels of the plurality of sub-panels;
the fourth sub-section is located among the plurality of second substrates of the plurality of sub-panels; and
a sectional shape of the third sub-section is inverted trapezoid.

10. The display panel of claim 6, wherein the seaming adhesive comprises a third sub-section and a fourth sub-section that are arranged continuously;
the third sub-section is located between adjacent third surfaces of first bank structures of the plurality of first bank structures of sub-panels of the plurality of sub-panels;
the fourth sub-section is located among the plurality of second substrates of the plurality of sub-panels; and
along a direction parallel to the first substrate, a width of the third sub-section is greater than a width of the fourth sub-section.

11. The display panel of claim 6, wherein each of the plurality of sub-panels further comprises a reflective layer located on a surface of a respective one of the plurality of bank structures; and the reflective layer is not disposed between the seaming adhesive disposed at the third surfaces of the plurality of first bank structures between adjacent sub-panels of the plurality of sub-panels and the third surfaces.

12. The display panel of claim 1, wherein the plurality of bank structures are disposed on the first substrate; and the plurality of light-emitting elements are disposed on the second substrate; or, wherein the plurality of light-emitting elements are disposed on the first substrate; and the plurality of bank structures are disposed on the second substrate.

13. The display panel of claim 1, wherein each of the plurality of pixel units comprises a plurality of sub-pixels;

the first substrate comprises a fifth sub-section and a sixth sub-section;

the fifth sub-section is located between vertical projections of two adjacent ones of the plurality of sub-pixels in a same one of the plurality of sub-panels on a plane where the first substrate is located;

the sixth sub-section is located between vertical projections of two adjacent ones of the plurality of sub-pixels in two different ones of the plurality of sub-panels on the plane where the first substrate is located; and an elastic modulus of the fifth sub-section is less than an elastic modulus of the sixth sub-section.

14. A preparation method of a display panel, comprising:

providing a first substrate and a plurality of second substrates, wherein the first substrate comprises a display region and a non-display region surrounding the display region;

aligning and bonding the plurality of second substrates to the first substrate, wherein one of the plurality of second substrates and the first substrate form a sub-panel; bezel adhesive, a plurality of bank structures, and a plurality of light-emitting elements are disposed between the first substrate and the plurality of second substrates; at least one of the plurality of light-emitting elements forms a pixel unit; each of the plurality of bank structures is located between adjacent pixel units; the plurality of light-emitting elements and the plurality of bank structures are located in the display region, and the bezel adhesive is located in the non-display region;

forming seaming adhesive between adjacent sub-panels on the first substrate; and curing the seaming adhesive to form a display panel;

wherein before aligning and bonding the plurality of second substrates to the first substrate, the method further comprises:

forming the bezel adhesive in the non-display region on the first substrate.

15. The preparation method of claim 14, wherein before aligning and bonding the plurality of second substrates to the first substrate, the method further comprises:

splicing the plurality of second substrates; wherein aligning and bonding the plurality of second substrates to the first substrate comprises:

disposing the first substrate on the plurality of second substrates spliced with the bezel adhesive facing towards the plurality of second substrates.

16. The preparation method of claim 14, wherein at least part of the plurality of second substrates each comprises a bezel adhesive placing region, and the non-display region comprises the bezel adhesive placing region; and wherein before aligning and bonding the plurality of second substrates to the first substrate, the method further comprises:

forming the bezel adhesive in the bezel adhesive placing region on the plurality of second substrates.

17. The preparation method of claim 16, wherein before aligning and bonding the plurality of second substrates to the first substrate, the method further comprises:

splicing the plurality of second substrates;

wherein aligning and bonding the plurality of second substrates to the first substrate comprises:

disposing the first substrate on the plurality of second substrates spliced.

18. A display device, comprising the display panel according to claim 1.

19. A display device, comprising the display panel according to claim 6.

* * * * *